United States Patent
Asano et al.

(10) Patent No.: US 9,664,533 B2
(45) Date of Patent: May 30, 2017

(54) MAGNETIC SENSOR DEVICE

(71) Applicant: Mitsubishi Electric Corporation, Chiyoda-ku (JP)

(72) Inventors: Hiroyuki Asano, Chiyoda-ku (JP); Toshiaki Shoji, Chiyoda-ku (JP); Tomokazu Ogomi, Chiyoda-ku (JP); Kenji Shimohata, Chiyoda-ku (JP); Masaaki Okada, Chiyoda-ku (JP); Miki Kagano, Chiyoda-ku (JP); Masashi Hino, Chiyoda-ku (JP); Hideki Matsui, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/765,382

(22) PCT Filed: Feb. 5, 2014

(86) PCT No.: PCT/JP2014/052642
§ 371 (c)(1),
(2) Date: Aug. 3, 2015

(87) PCT Pub. No.: WO2014/123142
PCT Pub. Date: Aug. 14, 2014

(65) Prior Publication Data
US 2015/0377650 A1    Dec. 31, 2015

(30) Foreign Application Priority Data

Feb. 7, 2013 (JP) ................................. 2013-022380
Jun. 10, 2013 (JP) ................................. 2013-121916
Oct. 24, 2013 (JP) ................................. 2013-221279

(51) Int. Cl.
G01B 7/14    (2006.01)
G01R 33/06    (2006.01)
(Continued)

(52) U.S. Cl.
CPC ............... *G01D 5/16* (2013.01); *G01R 33/09* (2013.01)

(58) Field of Classification Search
CPC .... G01D 5/145; G01D 5/2451; G01D 5/2454; G01D 5/16; G01B 7/003; G01B 7/023;
(Continued)

(56) References Cited

U.S. PATENT DOCUMENTS 5,512,822 A * 4/1996 Masuda ................... G07D 7/04
                                                  209/569
5,703,733 A * 12/1997 Suzuki ................... B82Y 10/00
                                                  360/55

(Continued)

FOREIGN PATENT DOCUMENTS

JP    2000 39472    2/2000
JP    2008 145379    6/2008
(Continued)

OTHER PUBLICATIONS

International Search Report issued May 13, 2014 in PCT/JP2014/052642 filed Feb. 5, 2014.
(Continued)

*Primary Examiner* — Vinh Nguyen
(74) *Attorney, Agent, or Firm* — Oblon, McClelland, Maier & Neustadt, L.L.P.

(57) ABSTRACT

A magnetic field generator disposed on one surface side of a sheet-shaped object-to-be-detected contains a magnetic component. The magnetic field generator includes a first magnetic pole part that forms a first magnetic pole, and a second magnetic pole part that forms a second magnetic pole with reverse polarity of the first magnetic pole. The magnetic field generator generates a cross magnetic field that crosses the object-to-be-detected. An MR element is disposed between the first magnetic pole part and the object-
(Continued)

to-be-detected. The resistance value of the MR element changes according to a change in a component of the cross magnetic field in a conveying direction. The position of the MR element in the conveying direction is position shifted along the conveying direction from the center position of the first magnetic pole part in the conveying direction, and located between both ends of the first magnetic pole part in the conveying direction.

4 Claims, 26 Drawing Sheets

(51) Int. Cl.
  *G01D 5/16* (2006.01)
  *G01R 33/09* (2006.01)
(58) Field of Classification Search
  CPC G01B 7/14; G01L 3/104; G01L 1/125; G01L 3/1435; G01L 1/122; G01L 1/127; G01L 3/102; G01R 33/04; G01R 33/09; G01R 33/091; G01R 33/34046; G01R 33/07; G01R 33/1215; H01F 13/003; H01H 2047/046; H01H 36/0033; H05K 2201/0397; H05K 2201/10727; H05K 2203/041; H05K 2203/0465; H05K 3/3442; G01N 27/72; G06F 19/3481
  See application file for complete search history.

(56) References Cited

U.S. PATENT DOCUMENTS

| | | | |
|---|---|---|---|
| 6,310,475 B1* | 10/2001 | Kawase | G01D 5/145 |
| | | | 194/317 |
| 9,234,947 B2* | 1/2016 | Ogomi | G01R 33/091 |
| 9,279,866 B2* | 3/2016 | Ogomi | G01R 33/096 |
| 2010/0156405 A1 | 6/2010 | Furukawa et al. | |
| 2011/0148408 A1 | 6/2011 | Meisenberg et al. | |
| 2011/0248705 A1 | 10/2011 | Matsumoto et al. | |
| 2014/0028308 A1 | 1/2014 | Ogomi et al. | |
| 2015/0102808 A1 | 4/2015 | Ogomi et al. | |

FOREIGN PATENT DOCUMENTS

| | | |
|---|---|---|
| JP | 2012 255770 | 12/2012 |
| WO | 2008 146809 | 12/2008 |

OTHER PUBLICATIONS

Extended Search Report issued Jan. 13, 2017 in European Patent Application No. 14748712.8.

* cited by examiner

FIG. 3A    FIG. 3B    FIG. 3C
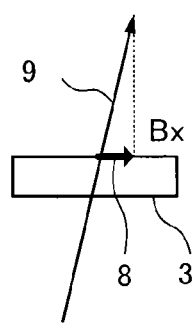 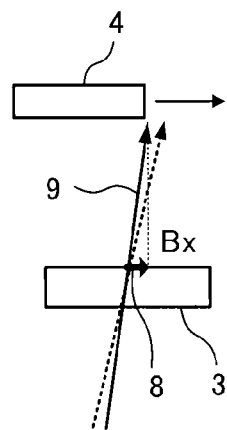 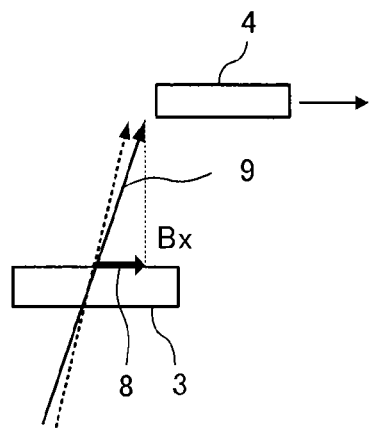
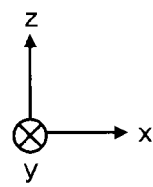 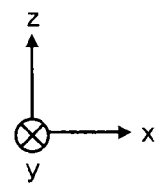 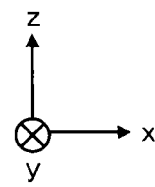

Bz DISTRIBUTION ON THE CENTRAL AXIS OF THE MAGNET

DISTANCE FROM THE CENTER OF THE MAGNET TO THE MR ELEMENT (mm)

FIG. 16A         FIG. 16B
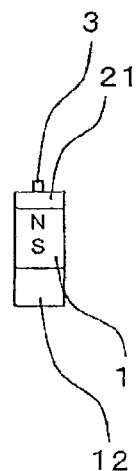 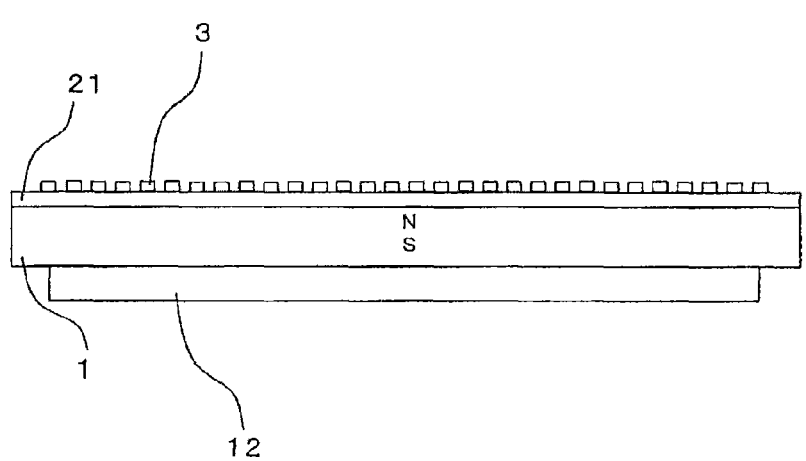
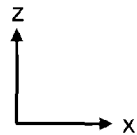 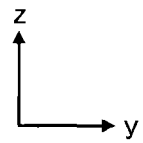

FIG. 20A
FIG. 20B
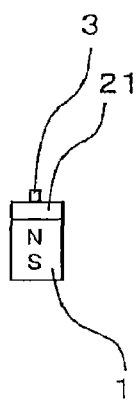
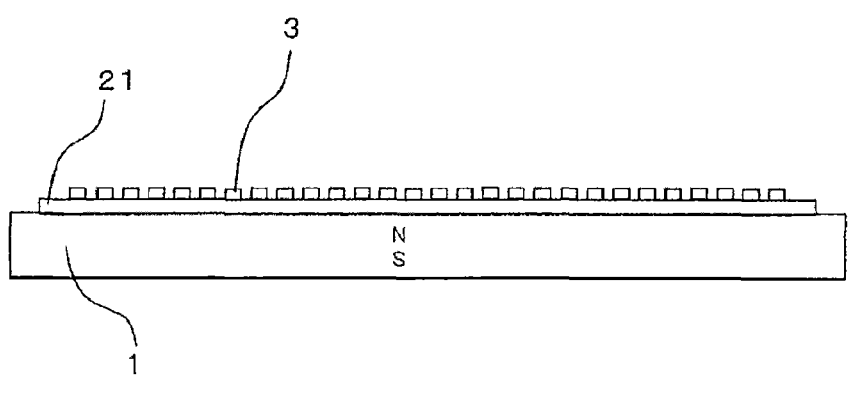
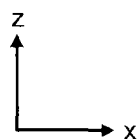
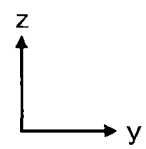

MAGNETIC SENSOR DEVICE

TECHNICAL FIELD

The present disclosure relates to a magnetic sensor device for detecting magnetic components included in a sheet-shaped object-to-be-detected.

BACKGROUND ART

Unexamined Japanese Patent Application Kokai Publication No. 2012-255770 (refer to Patent Literature 1) discloses a magnetic sensor device including a magnet and a magnetic resistance effect element (MR element). The magnet generates a cross magnetic field crossing the object-to-be-detected. In addition, the magnetic resistance effect element is disposed between the magnet and the object-to-be-detected, has an output terminal, and outputs a change in a conveying direction component of the cross magnetic field. This change in the resistance value is caused by the magnetic component of the object-to-be-detected conveyed in the cross magnetic field as a change in the resistance value. Patent Literature 1 describes, as a configuration configured to generate a cross magnetic field, a configuration in which magnets are arranged facing across each other the object-to-be-detected, and a configuration in which a magnet is placed on one side of the object-to-be-detected and magnetic material is placed facing across each other on the other surface of the object-to-be-detected.

CITATION LIST

Patent Literature

Patent Literature 1: Unexamined Japanese Patent Application Kokai Publication No. 2012-255770.

SUMMARY OF INVENTION

Technical Problem

The disclosure disclosed in Patent Literature 1 presents the following problem: that in order to generate a cross magnetic field, a configuration is required on both sides of an object-to-be-detected containing magnetic material and this increases the size of the magnetic sensor devices.

The present disclosure is made to solve the problem as described above, and the objective of the present disclosure is to obtain a compact magnetic sensor device.

Solution to Problem

The magnetic sensor device according to the present disclosure includes a magnetic field generator and a magnetic resistance effect element. The magnetic field generator is disposed on one surface side of a sheet-shaped object-to-be-detected that includes a magnetic component. The magnetic field generator includes a first magnetic pole part that forms a first magnetic pole, and a second magnetic pole part that forms a second magnetic pole including a reverse polarity of the first magnetic pole. The magnetic field generator generates a cross magnetic field crossing the object-to-be-detected by the first magnetic pole part and the second magnetic pole part. A magnetic resistance effect element is disposed between the first magnetic pole part and the object-to-be-detected. The resistance value of the magnetic resistance effect element changes in response to a change in a component of the cross magnetic field in a conveying direction, the change generated by the object-to-be-detected being conveyed in the cross magnetic field along the conveying direction parallel to the one surface side in the cross magnetic field. The position of the magnetic resistance effect element in the conveying direction is a position shifted along the conveying direction from the center position of the first magnetic pole part in the conveying direction, and is a position located between both ends of the first magnetic pole part in the conveying direction.

Advantageous Effects of Invention

In the present disclosure, the magnetic field generator is disposed on one surface side of the object-to-be-detected including a magnetic component. Therefore, according to the present disclosure, the magnetic field generator becomes compact, and a compact magnetic sensor device can be obtained.

BRIEF DESCRIPTION OF DRAWINGS

FIG. 3A is a vector diagram of the lines of magnetic force illustrating the detection principle of the magnetic sensor device shown in FIG. 1 (before passage of the object-to-be-detected);

FIG. 3B is a vector diagram of the lines of magnetic force illustrating the detection principle of the magnetic sensor device shown in FIG. 1 (at a time when the object-to-be-detected is approaching);

FIG. 3C is a vector diagram of the lines of magnetic force illustrating the detection principle of the magnetic sensor device shown in FIG. 1 (after passage of the object-to-be-detected);

FIG. 16A is a configuration diagram of a magnetic sensor device according to Embodiment 8 of the present disclosure (front view);

FIG. 16B is a configuration diagram of the magnetic sensor device according to Embodiment 8 of the present disclosure (side view);

FIG. 20A is a configuration diagram of a magnetic sensor device according to Embodiment 10 of the present disclosure (front view);

FIG. 20B is a configuration diagram of the magnetic sensor device according to Embodiment 10 of the present disclosure (side view);

DESCRIPTION OF EMBODIMENTS

Embodiment 1

Figure 1:
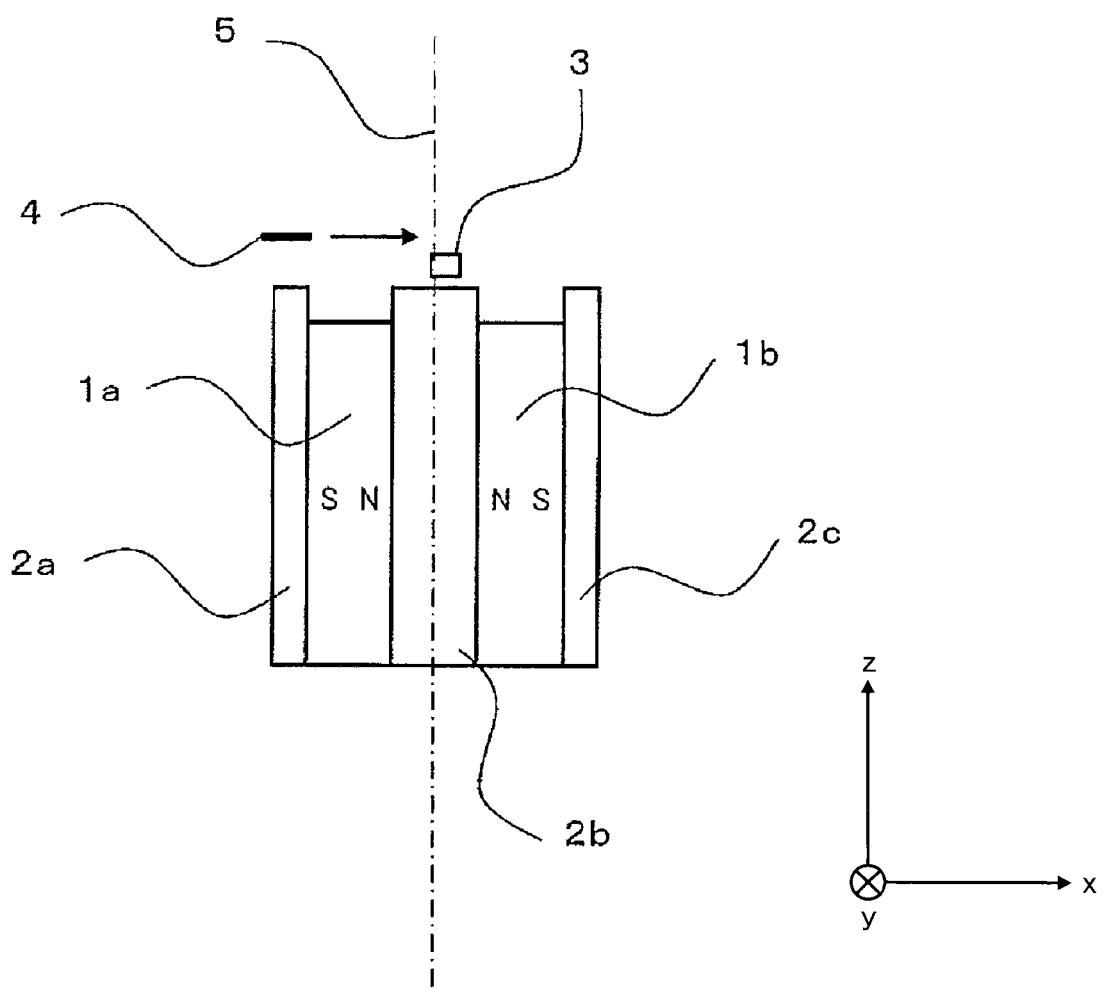
FIG. 1 is a configuration diagram of a magnetic sensor device according to Embodiment 1 of the present disclosure.

Embodiment 1 of the present disclosure is explained in reference to the drawings. FIG. 1 is a configuration diagram of a magnetic sensor device according to Embodiment 1 of the present disclosure. In FIG. 1, permanent magnets 1a and 1b are permanent magnets that are arranged in a line in the conveying direction (x-axis direction) of an object-to-be-detected 4 and have magnetic poles of the north pole and south pole. Yokes 2a, 2b, and 2c are yokes such as iron. An MR element 3 is a magnetic resistance effect element that outputs a change in the resistance value when there is a change in the magnetic field. The object-to-be-detected 4 is a sheet-shaped object-to-be-detected such as paper money on which magnetic material such as magnetic ink is printed. The object-to-be-detected 4 is, for example, a sheet-shaped print medium on which a micromagnetic pattern is formed (printed). The magnetic sensor device, for example, is a device detecting paper money (specifically, a micromagnetic pattern printed on the paper money). A central axis 5 is a central axis of the magnetic sensor device in the x-axis direction. In other words, the central axis 5 is an axis passing the center (center of gravity) in the x-axis direction and extending in the vertical direction of the magnetic sensor device. The x-axis, which extends in a direction indicated by an arrow, is a conveying direction of the object-to-be-detected 4. The y-axis is at right angles to the x-axis and the z-axis, and indicates a depth direction. And the z-axis is at right angles to the x-axis and the y-axis, and indicates a vertical direction.

The permanent magnets 1a and 1b are disposed so that the same magnetic poles (in FIG. 1, N pole) abut to both sides of the yoke 2b in the x-axis direction. Yokes 2a and 2c are disposed on the outside of the permanent magnets 1a and 1b in the x-axis direction (in FIG. 1, S pole side). The MR element 3 is disposed in the vicinity of the yoke 2b in the z-axis direction. In other words, the MR element 3 is disposed slightly apart from yoke 2b in the z-axis direction. Also, the MR element 3 is disposed offset (shifted) from the central axis 5 in the x-axis direction (in FIG. 1, output side from the central axis 5 in the conveying direction). The object-to-be-detected 4 is conveyed along the x-axis direction at a position apart from the yoke 2b further than the MR element 3 in the z-axis direction. In addition, the yokes 2a, 2b and 2c are disposed in such a way as to project beyond the permanent magnets 1a and 1b on the MR element 3 side along the z-axis direction. In other words, the ends of the yokes 2a, 2b and 2c on the MR element 3 side project towards the MR element 3 side more than the ends of the permanent magnets 1a and 1b on the MR element 3 side.

Figure 2:
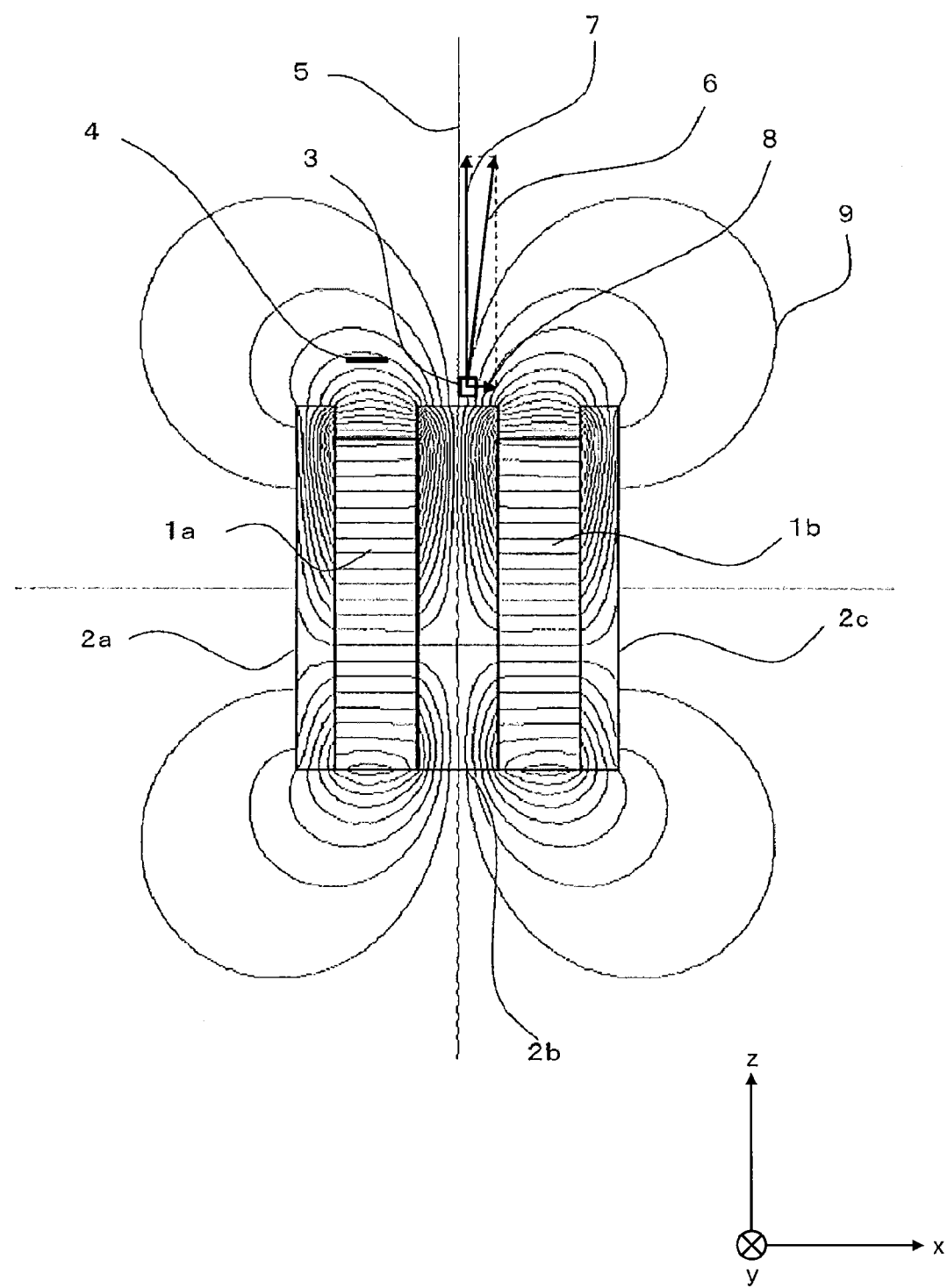
FIG. 2 is a distribution diagram of the lines of magnetic force of the magnetic sensor device shown in FIG. 1.

FIG. 2 is a distribution diagram of the lines of magnetic force of the magnetic sensor device shown in FIG. 1. The permanent magnets 1a and 1b are magnetized in the x-axis direction as shown in FIG. 1. The lines of magnetic force 9 generated from both of the permanent magnets 1a and 1b enter the yoke 2b from a contact surface between the permanent magnets 1a and 1b and the yoke 2b, and are emitted to the air from the yoke 2b in the z-axis direction (top surface of the yoke 2b). As the yoke 2b is disposed so as to project beyond the permanent magnets 1a and 1b on the MR element 3 side along the z-axis direction, the lines of magnetic force 9 are concentrated on the yoke 2b. In addition, as the yoke 2b is configured to be longer in the z-axis direction on the xz plane, the lines of magnetic force 9 are concentrated further on the top surface of the yoke 2b, and the magnetic flux density in the vicinity of the top surface of the yoke 2b is increased. The lines of magnetic force 9 emitted to the air from the yoke 2b enter the yokes 2a and 2c having a reverse polarity of the magnetic pole of the yoke 2b, and return to the permanent magnets 1a and 1b to form a closed loop.

An arrow 6 is an arrow showing a magnetic flux vector (the direction and magnitude of the magnetic flux vector) at the position of the MR element 3 (typically the center position of the MR element 3). An arrow 7 is an arrow showing the vertical direction (z-axis direction) component (the direction and magnitude of the vertical direction component of the magnetic flux vector) of the magnetic flux vector indicated by the arrow 6. An arrow 8 is an arrow showing the conveying direction (x-axis direction) component (the direction and magnitude of the conveying direction component of the magnetic flux vector) of the magnetic flux vector.

The lines of magnetic force 9 that are emitted to the air spread to the left and right. Also, as shown in FIG. 1, the position of the MR element 3 (typically the center position of the MR element 3) is shifted from the central axis 5 slightly to the x-axis direction (around 0.3 mm), and is a position apart from the surface of the yoke 2b slightly to the z-axis direction (around 0.5 mm). Therefore, at the position of the MR element 3 of FIG. 1, the conveying direction component of a low (slight) magnetic flux density exist in addition to the vertical direction component of a high magnetic flux density. The MR element 3 in the present disclosure is supposed to have properties to detect a conveying direction component of the magnetic flux density. The MR element 3 requires a bias magnetic field of around 2 mT (milli-Tesla) in the conveying direction to utilize its sensitivity to the maximum.

The operation of the magnetic sensor device is explained below. At a position in FIG. 2 where the MR element 3 is disposed, the vertical direction component of a large magnetic flux density exists, and simultaneously the conveying direction component of a small (slight) magnetic flux density also exists. This is because the MR element 3 is disposed at a position slightly apart from the central axis 5. Arranging the MR element 3 in this way can give the MR element 3 a bias magnetic field towards the conveying direction of around 2 mT (milli-Tesla) necessary for the MR element 3 to work appropriately.

When the object-to-be-detected 4 passes in the vicinity of the magnetic sensor device in such a state, the magnetic field distribution changes. When the magnetic field distribution changes, the direction of the magnetic flux vector applied to the MR element 3 slightly changes. Even a slight change results in a large rate of change of the conveying direction component. The change in the conveying direction component can be detected sufficiently using the MR element 3.

Detailed operations are explained in reference to FIG. 2, FIG. 3A, FIG. 3B, and FIG. 3C. FIG. 3A, FIG. 3B, and FIG. 3C are vector diagrams of the lines of magnetic force showing the detection principle of the magnetic sensor device according to Embodiment 1 of the present disclosure. In FIG. 2, the main component of the lines of magnetic force 9 is, around a position in which the MR element 3 is disposed, a component directed to the vertical direction of the yoke 2b, the component being a component of a cross magnetic field crossing the conveyance path. However, the MR element 3 is slightly apart toward the x-axis direction from the central axis 5. Therefore, as shown in FIG. 3A, the lines of magnetic force 9 is inclined slightly to the conveying direction (x-axis direction) from the vertical direction (z-axis direction). The conveying direction (x-axis direction) component of this magnetic field functions as a bias magnetic field of the MR element 3.

As shown in FIG. 3B, when the object-to-be-detected 4 approaches, the lines of magnetic force 9 are attracted to the object-to-be-detected 4 to incline to the side of the object-to-be-detected 4. Thus, the magnetic flux vector component (Bx indicated by the arrow 8) of the conveying direction (x-axis direction) is decreased. When the object-to-be-detected 4 is leaving, as shown in FIG. 3C, the lines of magnetic force 9 are pulled to the object-to-be-detected 4 to incline to the side of the object-to-be-detected 4. Thus, the magnetic flux vector component (Bx) of the conveying direction (x-axis direction) is increased. In this way, as the resistance value of the MR element 3, which senses the magnetism of the x-axis direction component, changes, the MR element 3 can detect the object-to-be-detected 4. In other words, as the magnetic flux vector component (Bx) of the conveying direction (x-axis direction) changes by the passage of the object-to-be-detected 4, the resistance value of the MR element 3 which senses the magnetism of x-axis direction component changes, and the MR element 3 can detect the object-to-be-detected 4. The dotted line arrow crossing the lines of magnetic force 9 in FIG. 3B and FIG. 3C shows the position of the lines of magnetic force 9 in FIG. 3A.

In other words, the change in the magnetic flux vector indicated by the arrow 6 is brought about by the passage of the object-to-be-detected 4. Therefore, the passage of the object-to-be-detected 4 can be detected by making such a configuration. As a result, a magnetic sensor device that can read a slight change in a magnetic field by the object-to-be-detected 4 can be provided.

In addition, when a magnetic sensor device including a certain size (length) in the direction perpendicular to the sheet surface of FIG. 1 (y-axis direction, depth direction) is manufactured, a long prismatic permanent magnet is required. In such a case, the aforementioned long prismatic permanent magnet may not be made because of reasons of restrictions at a manufacturing facility and the like. In this case, some permanent magnets are joined in the y-axis direction and used as one magnet. At this time, permanent magnets can be joined using yokes 2a, 2b, and 2c as guides as shown in FIG. 1, thus providing advantages of easy assembly of permanent magnets and minimized disorder of the magnetic field distribution around a joint of a permanent magnet.

In Embodiment 1 of the present disclosure, a case in which the MR element 3 is offset (shifted) from the central axis 5 to the output side in the conveying direction is explained. Similar functional effects can be obtained even if the MR element 3 is offset (shifted) from the central axis 5 to the input side in the conveying direction. In this case, the change in the magnetic flux vector component (Bx) of the conveying direction (x-axis direction) by the passage of the object-to-be-detected 4 is reversed to the cases of FIG. 3A, FIG. 3B, and FIG. 3C. In other words, the magnetic flux vector component (Bx) in the conveying direction (x-axis direction) changes so as to increase with the approach of the object-to-be-detected 4 and to decrease with the passage of the object-to-be-detected 4.

In this Embodiment, the yoke 2a, the permanent magnet 1a, the yoke 2b, the permanent magnet 1b, and the yoke 2c are stacked sequentially along the conveying direction to constitute a magnetic field generator. As the magnetic field generator is placed on one surface side of the object-to-be-detected 4, the magnetic field generator can be reduced in size. The yoke 2b (end of the yoke 2b on the object-to-be-detected 4 side in the z-axis direction) forms a first magnetic pole part, and the yoke 2a (end of the yoke 2a on the object-to-be-detected 4 side in the z-axis direction) and the yoke 2c (end of the yoke 2c on the object-to-be-detected 4 side in the z-axis direction) forms a second magnetic pole part.

Embodiment 2

Figure 4:
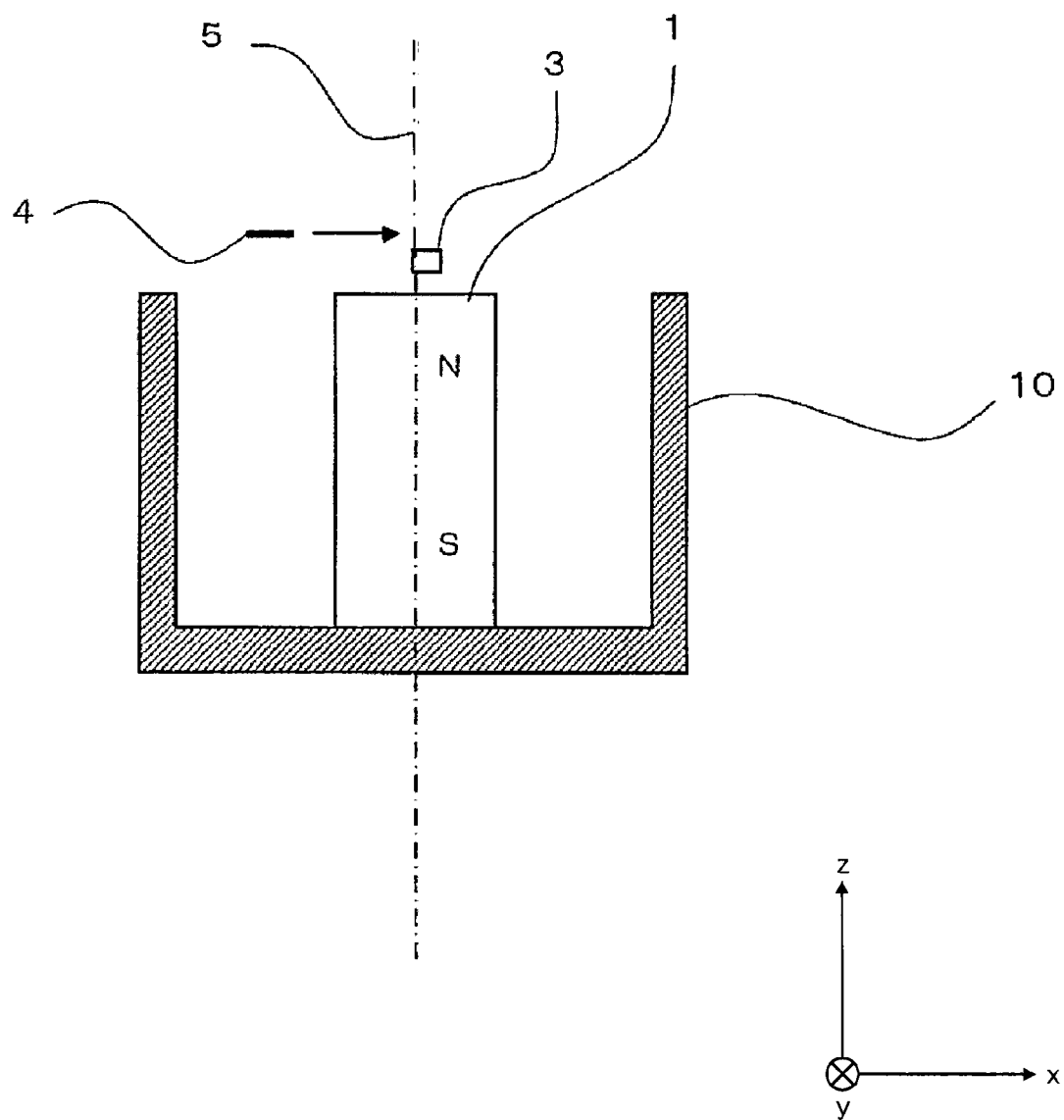
FIG. 4 is a configuration diagram of a magnetic sensor device according to Embodiment 2 of the present disclosure.

Embodiment 2 of the present disclosure is explained in reference to the drawings. FIG. 4 is a configuration diagram of a magnetic sensor device according to Embodiment 2 of the present disclosure. The magnetic sensor device includes a permanent magnet 1 and a yoke 10 as shown in FIG. 4. The yoke 10 has a box shape with a side wall part and a bottom part. Therefore, the cross-sectional view of the yoke 10 on the xz plane is approximately U-shaped. In FIG. 4, the same reference signs denote components identical or equivalent to those in FIG. 1, and the explanations are omitted.

The permanent magnet 1 is disposed in such a way that the north pole and the south pole form a line in the direction at right angles to the conveying direction of an object-to-be-detected 4 (vertical direction, or z-axis direction), and one magnetic pole (S pole in FIG. 4) abuts to the bottom of the yoke 10 in the z-axis direction. An MR element 3 is disposed in the vicinity of the permanent magnet 1 in z-axis direction. In other words, the MR element 3 is disposed slightly apart from the permanent magnet 1 in the z-axis direction. Also, the MR element 3 is disposed to be offset (shifted) from the central axis 5 in the x-axis direction. The object-to-be-detected 4 is conveyed in a direction indicated by an arrow in the x-axis direction at a position further apart from the MR element 3 in the z-axis direction with regard to the permanent magnet 1. The side surfaces of the permanent magnet 1 in the x-axis direction are spaced apart from the side walls of the yoke 10.

Figure 5:
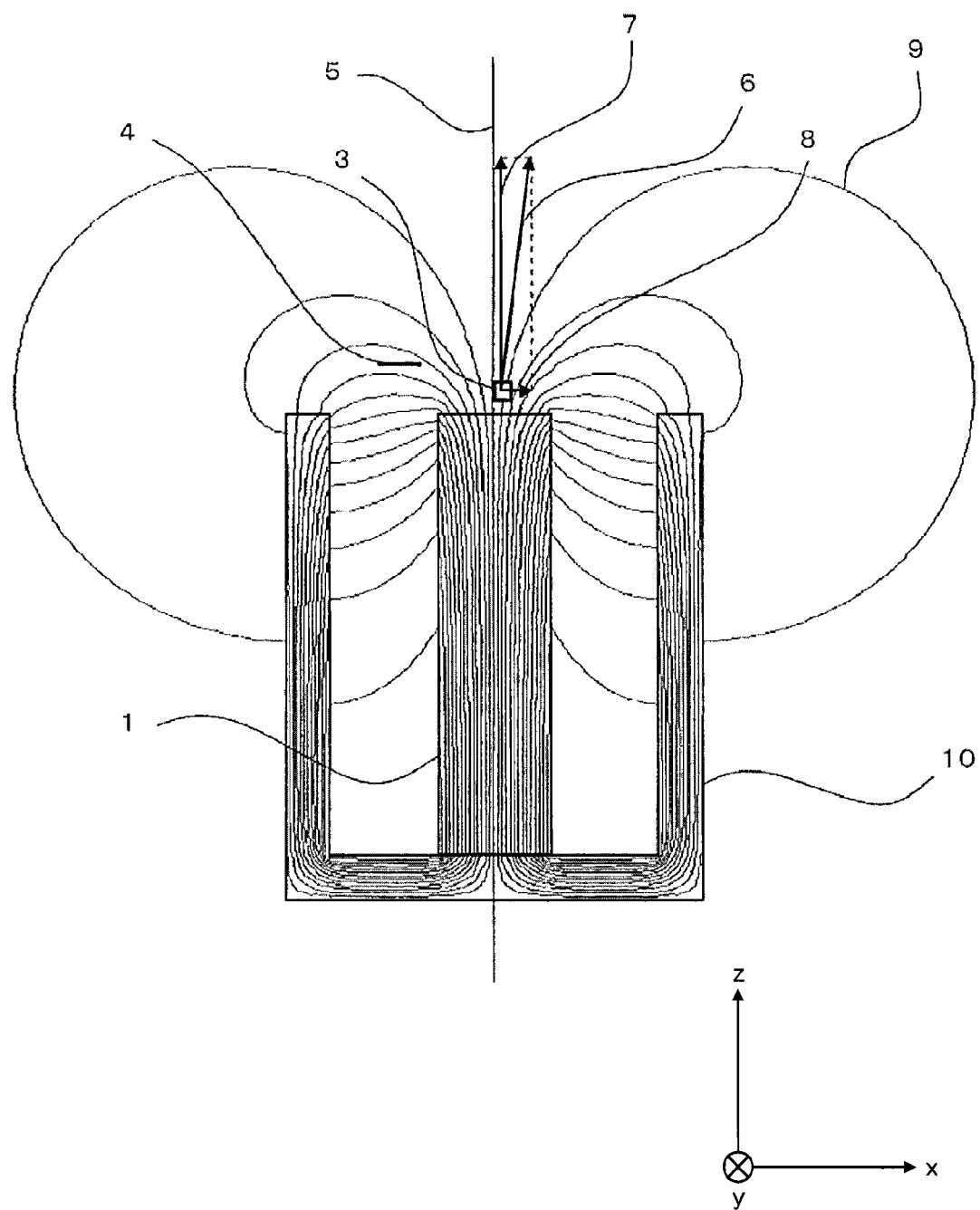
FIG. 5 is a distribution diagram of the lines of magnetic force of the magnetic sensor device shown in FIG. 4.

In this case, the permanent magnet 1 is magnetized in the longitudinal direction (z-axis direction) of FIG. 4. In addition, FIG. 5 is a distribution diagram of the lines of magnetic force of the magnetic sensor device shown in FIG. 4. The permanent magnet 1 is magnetized in the z-axis direction as shown in FIG. 4. The lines of magnetic force 9 generated from the permanent magnet 1 and are emitted to the air from one end (top surface of the permanent magnet 1, that is, one magnetic pole of the permanent magnet 1) of the permanent magnet 1 in the z-axis direction. Magnetic flux density is concentrated on the permanent magnet 1 at the magnetic pole end. Therefore, the lines of magnetic force 9 are concentrated on the top surface of the permanent magnet 1, and the magnetic flux density in the vicinity of the top surface of the permanent magnet 1 (in the vicinity of the end of the permanent magnet 1 on the conveyance path side) is increased. The lines of magnetic force 9 that are emitted to the air from the permanent magnet 1 form a closed loop in which the lines of magnetic force 9 enter the side wall part of the yoke 10, pass through the inside of the yoke 10, and return to the other magnetic pole of the permanent magnet 1. Use of such shaped yoke 10 reduces an area in which the lines of magnetic force 9 pass in the air, thereby providing a high magnetic flux density.

With this configuration of the magnetic sensor device, magnetic field distribution similar to Embodiment 1 of the present disclosure is formed in the vicinity of the top surface of the permanent magnet 1 by forming a magnetic sensor device. Because of this, an operation similar to Embodiment 1 of the present disclosure can be obtained and passage of the object-to-be-detected 4 can be detected.

When a magnetic sensor device including a certain size (length) in the direction perpendicular to the sheet surface of FIG. 4 (y-axis direction) is manufactured, a long prismatic permanent magnet is required. In such a case, the aforementioned long prismatic permanent magnet may not be made due to reasons of manufacturing the permanent magnet. In this case, some permanent magnets are joined together in the y-axis direction and used as one magnet. Permanent magnets can be guided by the yoke 10 as shown in FIG. 4 and joined. Thus, there is the advantage of easily assembling permanent magnets, and disorders of the magnetic field distribution around the joints of the permanent magnets can be minimized.

In this Embodiment, a magnetic field generator is formed by mounting the permanent magnet 1 on the bottom of the yoke 10. As the magnetic field generator is placed on one surface side of the object-to-be-detected 4, the magnetic field generator can be reduced in size. An end of the permanent magnet 1 on the object-to-be-detected 4 side in the z-axis direction forms a first magnetic pole part, and the yoke 10 (an end of the yoke 10 on the object-to-be-detected 4 side in the z-axis direction) forms a second magnetic pole part.

Embodiment 3

Figure 6:
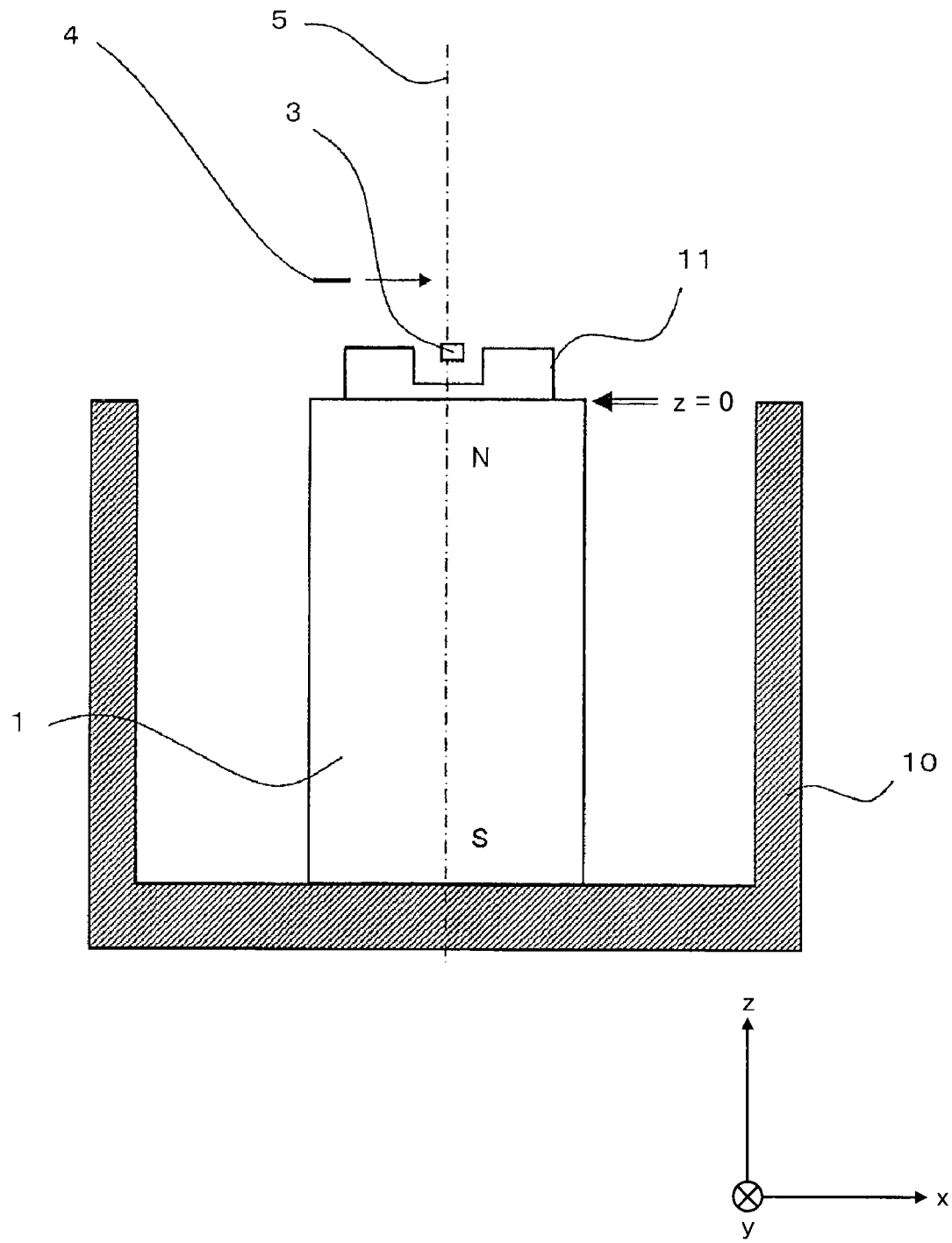
FIG. 6 is a configuration diagram of a magnetic sensor device according to Embodiment 3 of the present disclosure.

FIG. 6 is a configuration diagram of a magnetic sensor device according to Embodiment 3 of the present disclosure. The permanent magnet part shown in FIG. 6 is a modification example of the permanent magnet 1 in Embodiment 2 of the present disclosure. As shown in FIG. 6, a yoke 11 is placed on the top surface of the magnetic pole (in FIG. 6, N pole) of a permanent magnet 1 on an MR element 3 side. The yoke 11 is formed of magnetic material such as iron and is configured to have a recess around the central axis 5. In FIG. 6, the same reference signs denote components identical or equivalent to those in FIG. 4, and the explanations are omitted.

Figure 7:
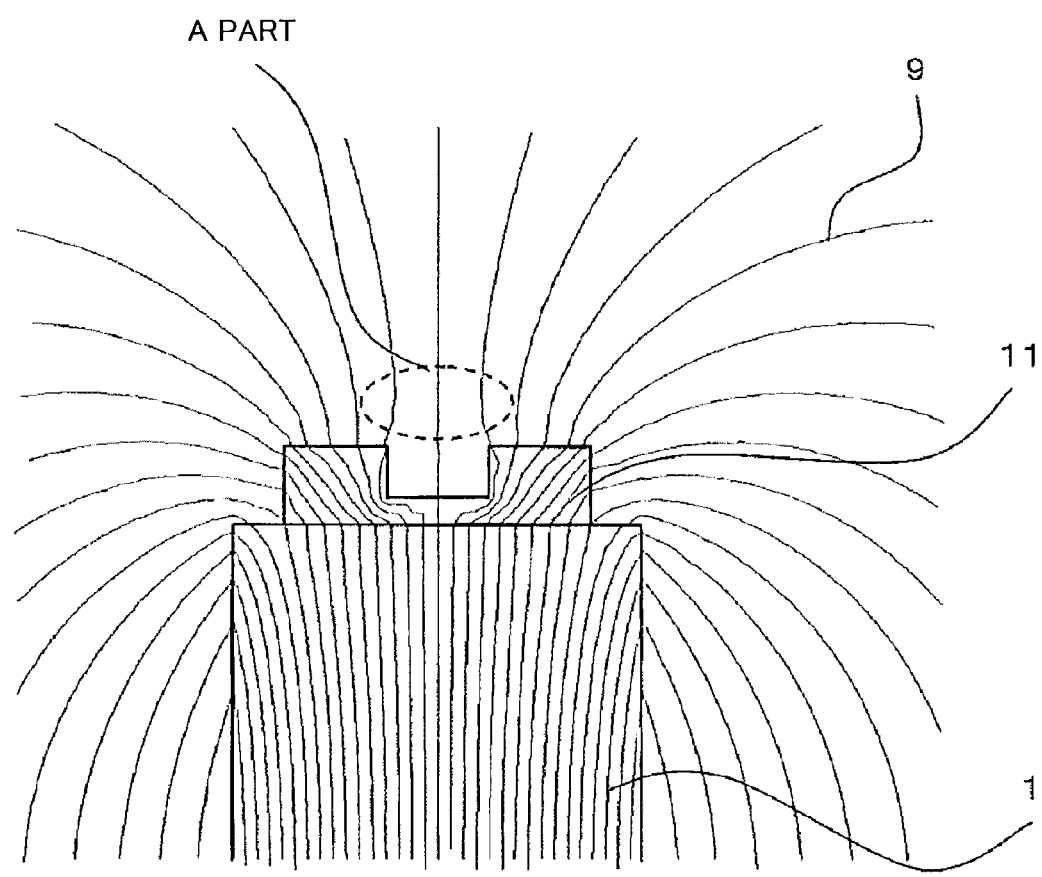
FIG. 7 is a distribution diagram of the lines of magnetic force near a yoke of the magnetic sensor device shown in FIG. 6.

FIG. 7 is a distribution diagram of the lines of magnetic force near the yoke 11 of the magnetic sensor device shown in FIG. 6. The permanent magnet 1 is magnetized in the z-axis direction as shown in FIG. 6. The lines of magnetic force 9 generated from the permanent magnet 1, enter the yoke 11 from one end of the yoke 11 in the z-axis direction (contact portion of the yoke 11 with the permanent magnet 1), and are emitted to the air from the other end of the yoke 11 in the z-axis direction (top surface of the yoke 11). The lines of magnetic force 9 emitted to the air from the area surrounding of the recess of the yoke 11 have a distribution such that the lines of magnetic force 9 is diverged after converged once in the z-axis direction. In this way, magnetic flux density is increased at a position (A part) apart from the yoke 11 in the z-axis direction.

Figure 8:
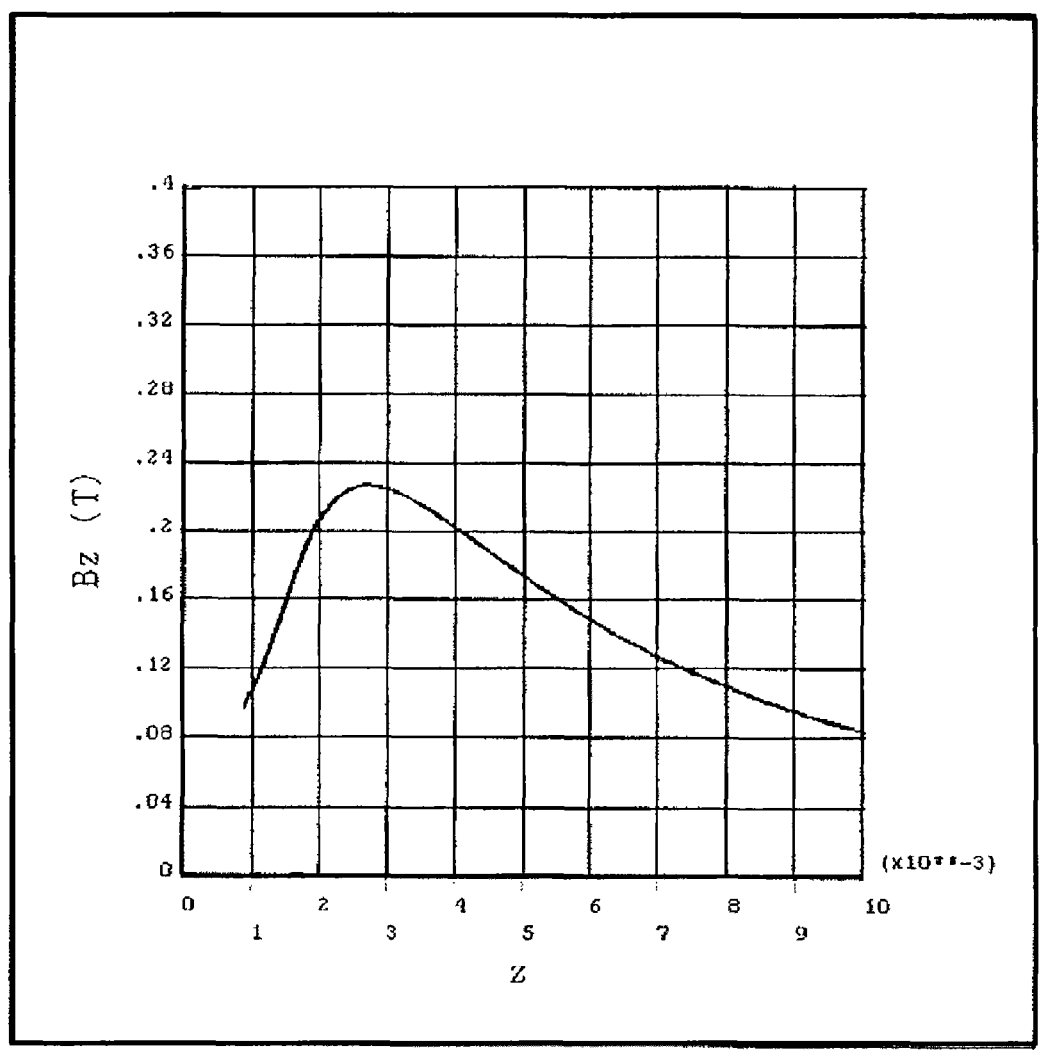
FIG. 8 is a graph illustrating strength changes of the magnetic flux density in a z-axis direction, assuming that a contact portion between the yoke and the permanent magnet is defined as a reference (z=0) and a direction leaving the yoke and the permanent magnet is defined as a positive direction.

FIG. 8 is a graph illustrating strength changes (results of calculation) of the magnetic flux density in the z-axis direction assuming that a contact portion between the yoke 11 and the permanent magnet 1 is defined as a reference (z=0) and the direction leaving the yoke 11 and the permanent magnet 1 is a positive direction. As obvious from FIG. 8, it is understood that after the magnetic flux density reaches its peak, the strength change of the magnetic flux density is decreased as the position on the z-axis is apart from the yoke 11 and the permanent magnet 1.

In this way, by adopting Embodiment 3 of the present disclosure, even if an object-to-be-detected 4 passes a position away from the MR element 3, the deviation of the magnetic field change sensed by the MR element 3 can be minimized. As a result, the distance dependency of the electrical signal obtained by the MR element 3 between the object-to-be-detected 4 and the MR element 3 can be minimized.

Embodiment 4

Figure 9:
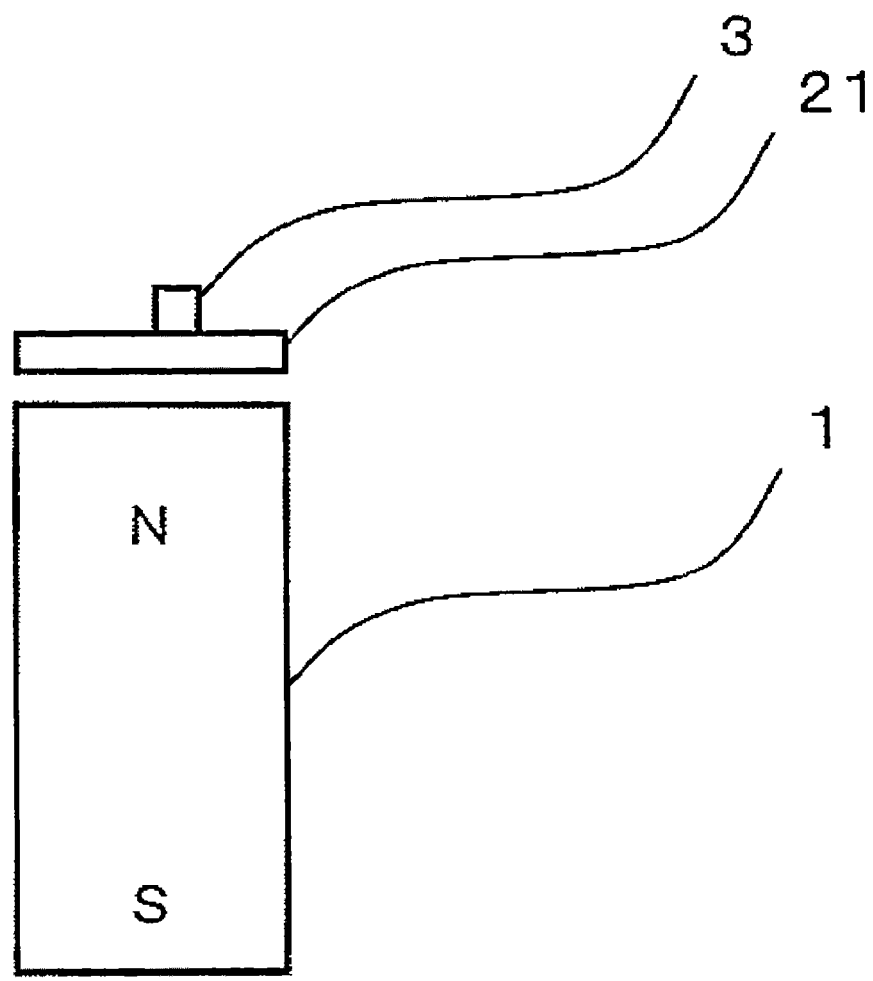
FIG. 9 is a configuration diagram of a permanent magnet part included in a magnetic sensor device according to Embodiment 4 of the present disclosure.
Figure 10:
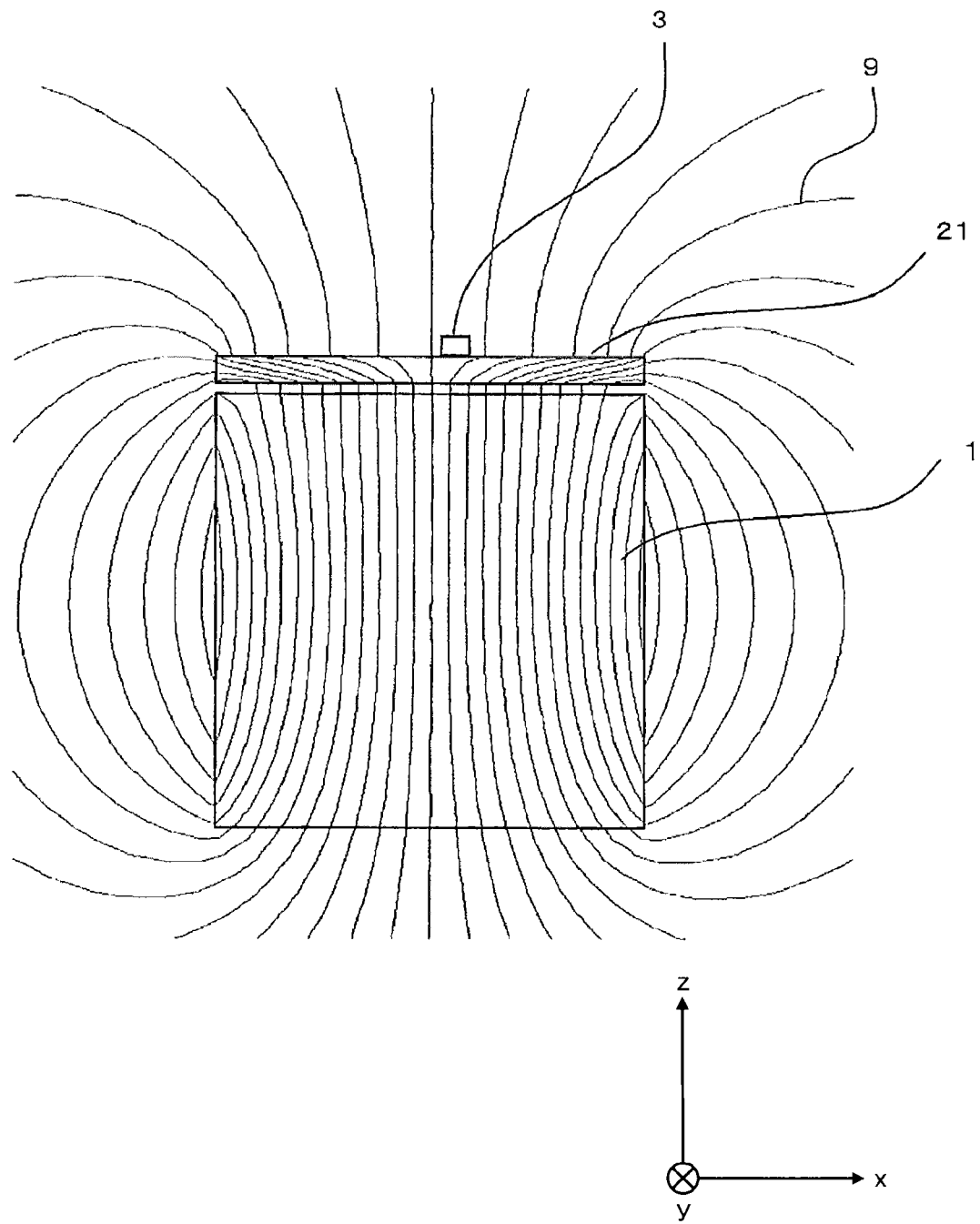
FIG. 10 is a distribution diagram of the lines of magnetic force of the magnetic sensor device shown in FIG. 9.

FIG. 9 shows a configuration of the permanent magnet part included in the magnetic sensor device according to Embodiment 4 of the present disclosure. In FIG. 9, a magnetic metal 21 is a part made of magnetic material (magnetic metal) such as iron. Also, FIG. 10 is a distribution diagram of the lines of magnetic force of the magnetic sensor device including the permanent magnet part shown in FIG. 9. In FIGS. 9 and 10, the same reference signs denote components identical or equivalent to those in FIG. 4, and the explanations are omitted.

A permanent magnet 1 includes magnetic poles arranged in the z-axis direction, and the magnetic metal 21 is disposed apart from one magnetic pole (in FIG. 9, N pole) in the z-axis direction. An MR element 3 is mounted on the magnetic metal 21.

The permanent magnet 1 is magnetized in the z-axis direction as shown in FIG. 10. The lines of magnetic force 9 generated from the permanent magnet 1, once pass through the air and some enter the magnetic metal 21. The lines of magnetic force 9 are emitted to the air again. When the lines of magnetic force 9 are emitted to the air, the lines of magnetic force 9 have a property of being emitted to the air vertically from the surface of the magnetic metal 21. Thus, when the MR element 3 is disposed near the surface of the magnetic metal 21, a large magnetic field is applied to the MR element 3 in the vertical direction (z-axis direction), and an extremely slight magnetic field is applied in the conveying direction (x-axis direction). The magnetic field to be applied to the MR element 3 in the conveying direction is a low magnetic flux density of about 2 mT. Therefore, the situation as described above is very favorable for the MR element.

Figure 11:
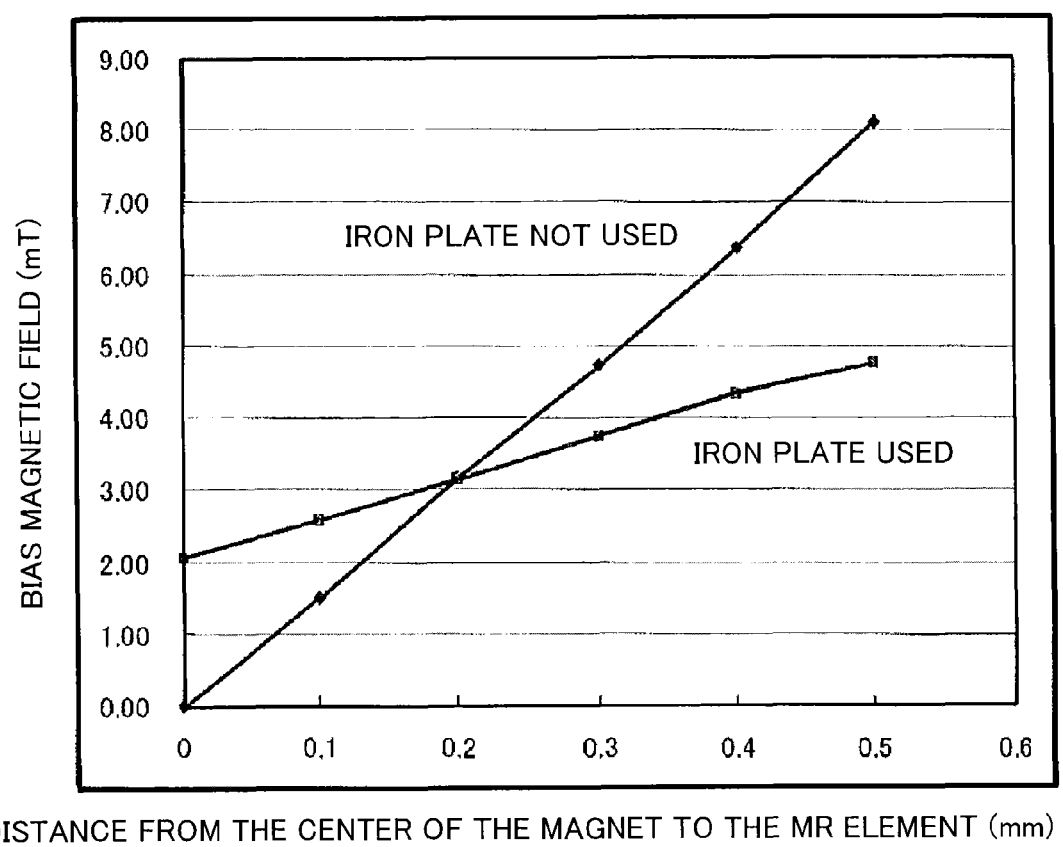
FIG. 11 is a graph illustrating changes of the magnetic flux density in the conveying direction when an MR element is fixed to a magnetic metal and the MR element and the magnetic metal are moved together and when the magnetic metal is not utilized and only the MR element is moved in the magnetic field formed by the permanent magnet.

FIG. 11 shows changes in the magnetic flux density in the conveying direction at positions of the MR element 3 when an iron plate is used and when an iron plate is not used. When the iron plate is used, the MR element 3 is fixed to the magnetic metal 21 and the MR element 3 and the magnetic metal 21 are moved together. On the other hand, when the iron plate is not used, only the MR element 3 is moved in the magnetic field formed by the permanent magnet 1 without using the magnetic metal 21. As understood from FIG. 11, when the MR element 3 is fixed to magnetic metal 21 and the MR element 3 and the magnetic metal 21 are moved together, a change in the magnetic flux density in the conveying direction (x-axis direction) is small and positioning the MR element 3 is easy.

When the object-to-be-detected 4 passes in the vicinity of the MR element 3 in the magnetic field formed as above, the direction of the magnetic flux applied to the MR element 3 changes slightly. Although this is a slight change, the change in the conveying direction component (x-axis direction) is a large rate change. Therefore, as the MR element 3 can detect this change, a magnetic sensor device having excellent sensitivity can be provided.

In FIGS. 9 and 10 illustrating Embodiment 4 of the present disclosure, the magnetic metal 21 is disposed apart from one magnetic pole of the permanent magnet 1. In the present disclosure, the magnetic metal 21 has similar functional effects even if the magnetic metal 21 abuts to one magnetic pole of the permanent magnet 1.

Figure 12:
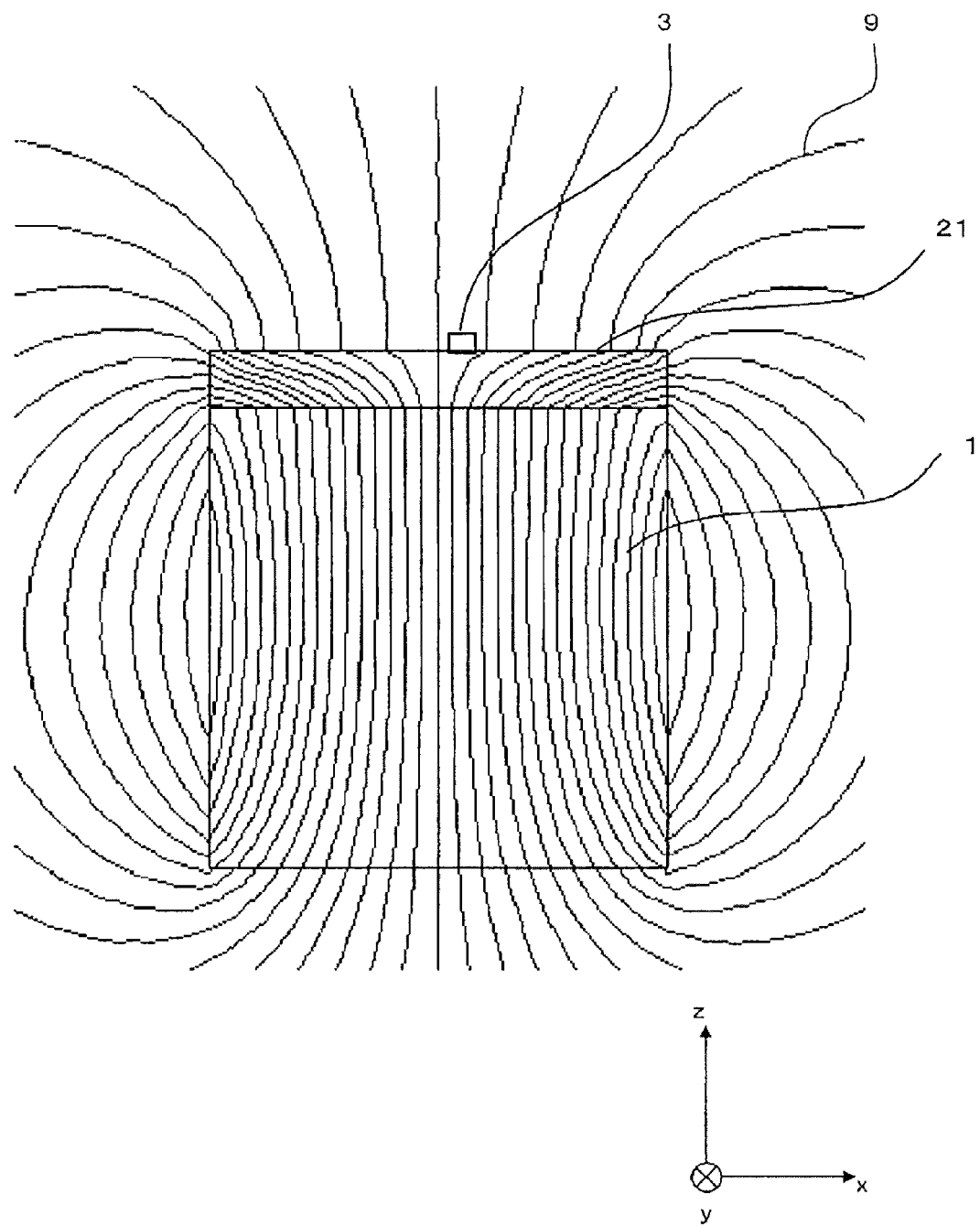
FIG. 12 is a distribution diagram of the lines of magnetic force of the magnetic sensor device when the magnetic metal is disposed to abut to one magnetic pole of the permanent magnet.

FIG. 12 is a distribution diagram of the lines of magnetic force of the magnetic sensor device when the magnetic metal 21 is disposed to abut to one magnetic pole of the permanent magnet 1. As shown in FIG. 12, the lines of magnetic force 9 are emitted to the air perpendicularly from the surface of the magnetic metal 21. Therefore, when the MR element 3 is positioned near the surface of the magnetic metal 21, a large magnetic field in the vertical direction (z-axis direction) is applied to the MR element 3, and a slight magnetic field is applied thereto in the conveying direction (x-axis direction). In other words, functional effects similar to the case in which the magnetic metal 21 is disposed apart from one magnetic pole of the permanent magnet 1 can be obtained.

In this Embodiment, a magnetic field generator is formed by the permanent magnet 1. As the magnetic field generator is placed on one surface side of the object-to-be-detected 4, the magnetic field generator can be reduced in size. The end of the permanent magnet 1 on the object-to-be-detected 4 side in the z-axis direction forms a first magnetic pole part, and the other end of the permanent magnet 1 on the opposite side of the object-to-be-detected 4 in the z-axis direction forms a second magnetic pole part.

Embodiment 5

Figure 13:
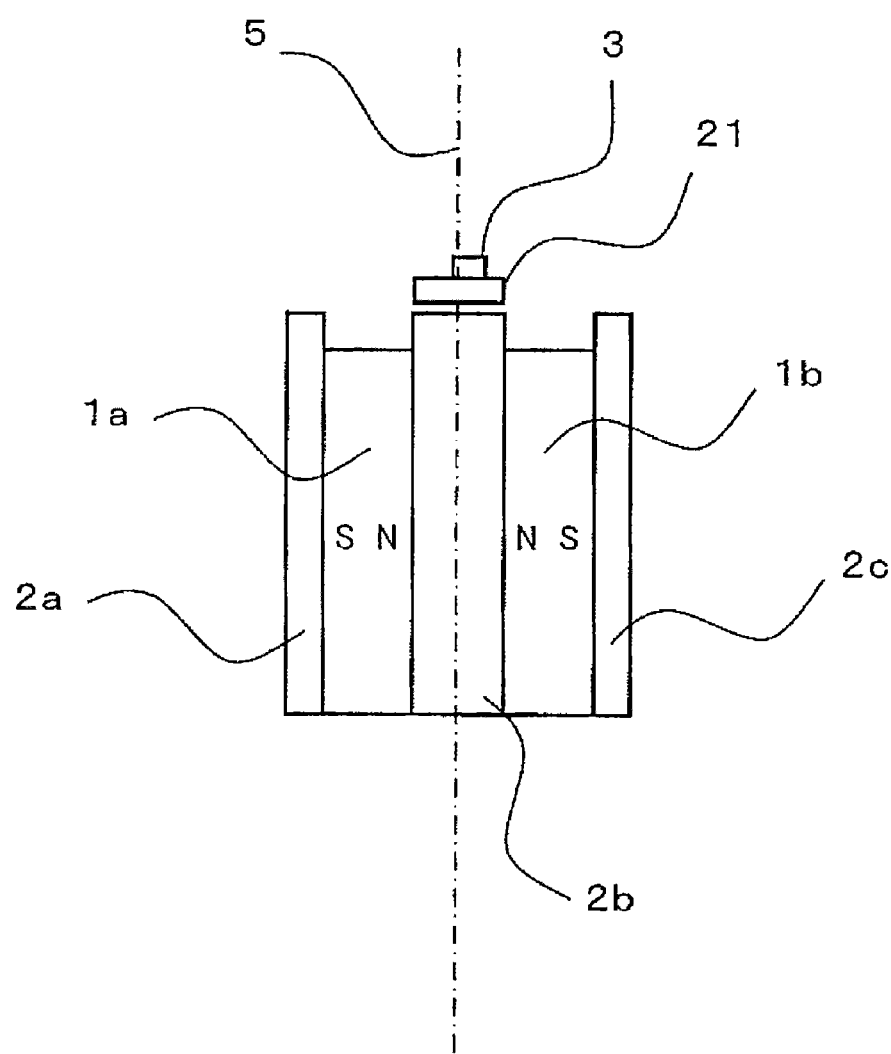
FIG. 13 is a configuration diagram of a magnetic sensor device according to Embodiment 5 of the present disclosure.
Figure 13:
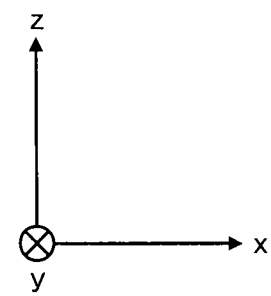
Figure 14:
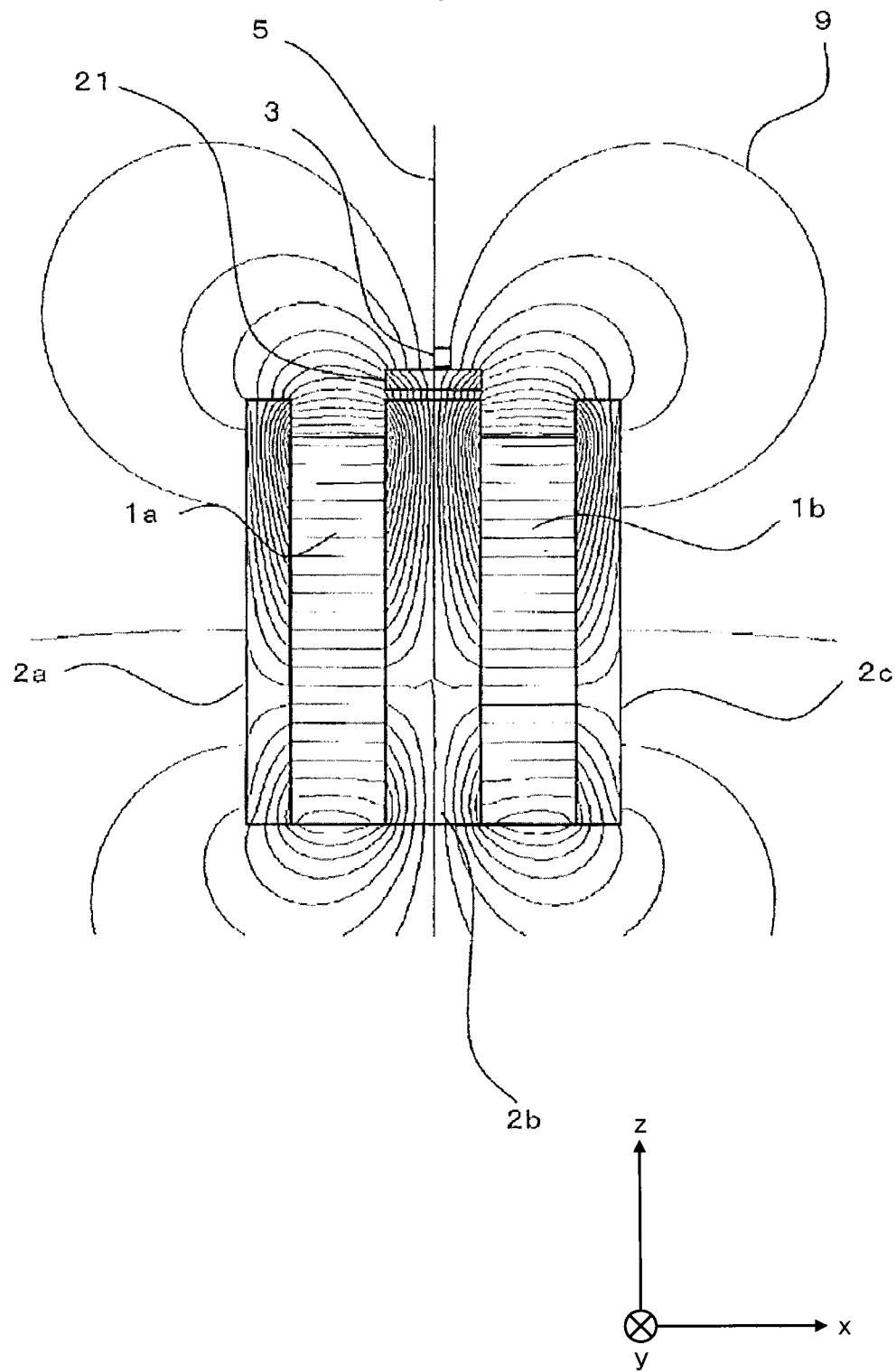
FIG. 14 is a distribution diagram of the lines of magnetic force of the magnetic sensor device shown in FIG. 13.

FIG. 13 shows a configuration of the permanent magnet of the magnetic sensor device according to Embodiment 5 of the present disclosure. FIG. 13 shows a modification example of the magnetic sensor device according to Embodiment 1 of the present disclosure. In FIG. 13, the magnetic metal 21 is a magnetic material part, such as iron, and an MR element 3 is mounted on the magnetic metal 21. Also, FIG. 14 is a distribution diagram of the lines of magnetic force of the magnetic sensor device shown in FIG. 13. In FIGS. 13 and 14, the same reference signs denote components identical or equivalent to those in FIG. 1, and the explanations are omitted.

The magnetic field distribution of this magnetic sensor device is shown in FIG. 14. As explained in Embodiment 4 of the present disclosure, the lines of magnetic force 9 are emitted vertically from the surface of the magnetic metal 21 from the upper side of the magnetic metal 21, even in the case of Embodiment 5 of the present disclosure. Therefore, when the MR element 3 is disposed near the surface of the magnetic metal 21, a large magnetic field is applied to the MR element 3 in the vertical direction (z-axis direction), and a slight magnetic field is applied thereto in the conveying direction (x-axis direction), and effects similar to Embodiment 4 of the present disclosure can be obtained.

Furthermore, even if the magnetic fields generated by the individual permanent magnets 1a and 1b are small, magnetic fields generated by two permanent magnets are joined to be a large magnetic field around the upper side surface of the yoke 2b. Thus, such a configuration can obtain a large magnetic field. As a result, cheap permanent magnets can be utilized and costs can be reduced.

In FIGS. 13 and 14, showing Embodiment 5 of the present disclosure, the magnetic metal 21 is disposed apart from the yoke 2b. In the present disclosure, the magnetic metal 21 has similar functional effects when the magnetic metal 21 abuts to the yoke 2b.

Embodiment 6

The yoke 11 shown in FIG. 6 can be disposed between the magnetic metal 21 and the permanent magnet 1 shown in FIG. 9. Such a configuration further has effects that a large magnetic field is applied to the MR element 3 in the vertical direction (z-axis direction) and a slight magnetic field is applied thereto in the conveying direction (x-axis direction), compared to Embodiment 4 of the present disclosure. Similarly, the yoke 11 shown in FIG. 6 can be disposed between the magnetic metal 21 and the yoke 2b shown in FIG. 13. Such a configuration has effects that a large magnetic field is further applied to the MR element 3 in the vertical direction (z-axis direction) and a slight magnetic field is applied in the conveying direction (x-axis direction) compared to Embodiment 5 of the present disclosure.

Embodiment 7

Figure 15:
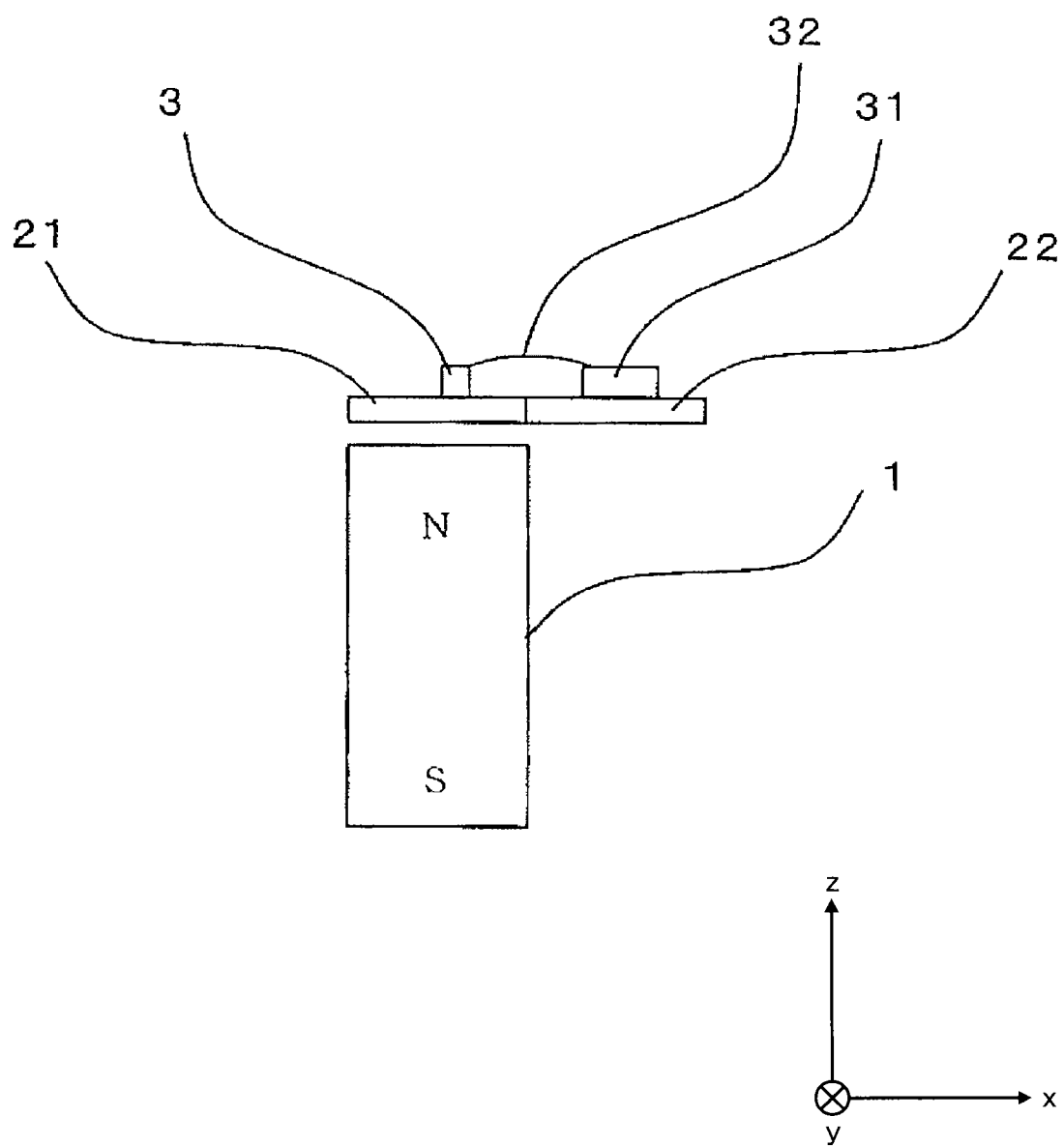
FIG. 15 is a configuration diagram of a magnetic sensor device according to Embodiment 7 of the present disclosure.

FIG. 15 is a configuration diagram of a magnetic sensor device according to Embodiment 7 of the present disclosure.

In FIG. 15, non-magnetic metal 22 is a non-magnetic metal such as aluminum, copper, and the like that is extended in the conveying direction (x-axis direction) of an object-to-be-detected 4 from the magnetic metal 21 such as iron and is integrated into the magnetic metal 21. The non-magnetic metal 22 is joined to the magnetic metal 21 by fused joining such as brazing and welding, or the mechanical joining such as caulking. An integrated circuit (IC) 31 is mounted on the non-magnetic metal 22 by adhesion or the like, and processes an output signal from the MR element 3 mounted on the magnetic metal 21. The IC 31 and the MR element 3 are connected electrically via a wire bonding using a wire 32. In FIG. 15, the same reference signs denote components identical or equivalent to those in FIG. 9, and the explanations are omitted.

It is desirable for the IC 31 to be mounted on a metal carrier to perform heat radiation of the IC 31 efficiently. The lines of magnetic force 9 of the permanent magnet 1 expand on the side of the metal carrier of the IC 31 and distributions of the lines of magnetic force are disturbed when the non-magnetic metal 22 is formed with the magnetic metal. The lines of magnetic force 9 from the permanent magnet 1 are concentrated on the magnetic metal 21 by forming the carrier of the IC 31 in the non-magnetic metal 22. Therefore, the distribution of the lines of magnetic force of Embodiment 7 of the present disclosure is similar to the distribution of Embodiment 4 of the present disclosure, and functional effects similar to Embodiment 4 of the present disclosure can be obtained.

The MR element 3 and the IC 31 are each mounted on the integrally formed magnetic metal 21 and the non-magnetic metal 22. Therefore, as shown in Embodiment 4 of the present disclosure, when the position of the MR element 3 in the conveying direction is adjusted, the distance between the MR element 3 and the IC 31 does not change because the MR element 3 and the IC 31 are moved together, and the disclosure according to Embodiment 7 has effects that a signal of good quality is input into the IC 31.

Embodiment 8

FIGS. 16A and 16B are diagrams of configuration of the magnetic sensor device according to Embodiment 8 of the present disclosure. FIG. 16A is a configuration diagram (front view) of the magnetic sensor device when observed the magnetic sensor device from the y-axis direction. FIG. 16B is a configuration diagram (side view) of the magnetic sensor device when observed from the x-axis direction. In FIGS. 16A and 16B, a yoke 12 is a yoke disposed on the magnetic pole side (in FIGS. 16A and 16B, S pole) opposite side to the mounting side (in FIGS. 16A and 16B, N pole) of the MR element 3 of the permanent magnet 1. In FIGS. 16A and 16B, the same reference signs denote components identical or equivalent to those in FIG. 9, and the explanations are omitted.

As shown in FIG. 16B, a plurality of MR elements 3 arranged in a line in a direction orthogonal to the conveying direction (y-axis direction) are mounted on the magnetic metal 21. As the magnetic metal 21 is magnetic material, the magnetic metal works as a yoke. The length of the magnetic metal 21 in the y-axis direction is the same as the length of the permanent magnet 1 in the y-axis direction and the ends of the magnetic metal 21 in the y-axis direction are flush with the ends of the permanent magnet 1 in the y-axis direction. On the other hand, the length of the yoke 12 in the y-axis direction is shorter than the length of the permanent magnet 1 in the y-axis direction, and the ends of the yoke 12 in the y-axis direction are recessed from the ends of the permanent magnet 1 in the y-axis direction.

Figure 17:
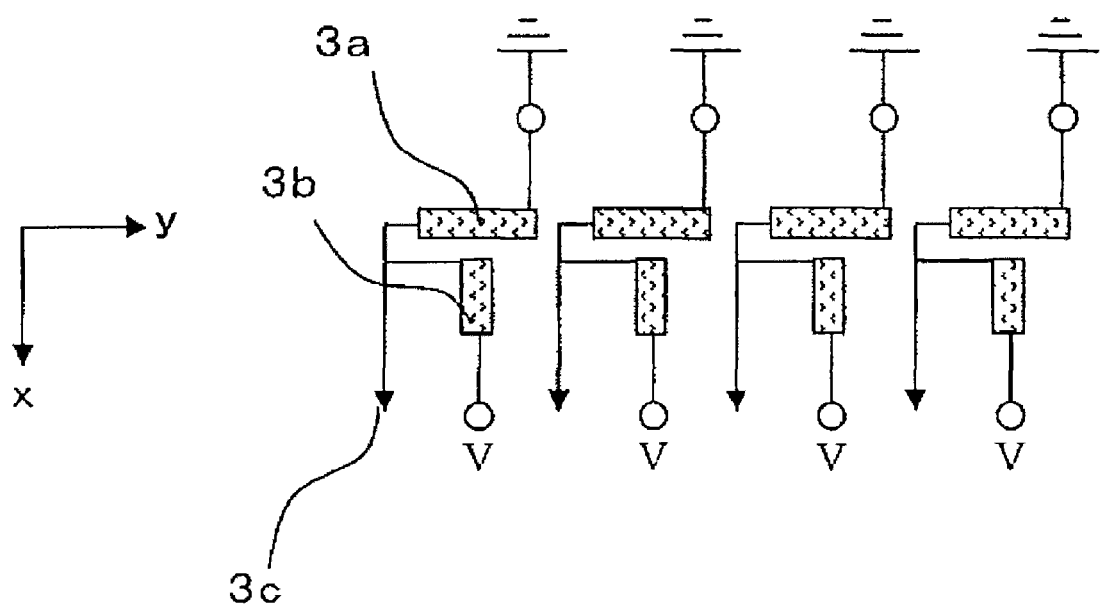
FIG. 17 is a diagram illustrating in detail the placement of the MR element of the magnetic sensor device shown in FIG. 16A.

FIG. 17 is a diagram illustrating in detail the placement of the MR element 3 of the magnetic sensor device according to Embodiment 8 of the present disclosure. The MR element 3, as shown in FIG. 17, includes a sensing element 3a, a cancellation element 3b and a signal pick-up terminal 3c. The sensing element 3a is disposed at right angles to the cancellation element 3b such that the sensing element 3a extends in the y-axis direction and the cancellation element 3b extends in the x-axis direction. Such repetitive structures are arranged in the y-axis direction.

A bias magnetic field is a magnetic field in the x-axis direction. In the situation in which a bias magnetic field having an appropriate magnitude is applied, the sensing element 3a detects a change in a slight magnetic field and changes the resistance value thereof. On the other hand, in the situation in which a bias magnetic field is applied, a magnetic field is applied to the cancellation element 3b only in the longitudinal direction. Therefore, the cancellation element 3b does not detect the change in the magnetic field and does not change the resistance value. As a result, a change in the magnetic field can be readed as the voltage change of the signal pick-up terminal 3c.

However, when a magnetic field in the y-axis direction is further applied in the above-mentioned situation, the sensing element 3a has a property that the sensitivity of the sensing element 3a is decreased and at the same time a bias magnetic field is applied to the cancellation element 3b. Therefore, a change in the resistance value of the cancellation element 3b, which is not intended, is generated, and an intended operation cannot be obtained.

Figure 18:
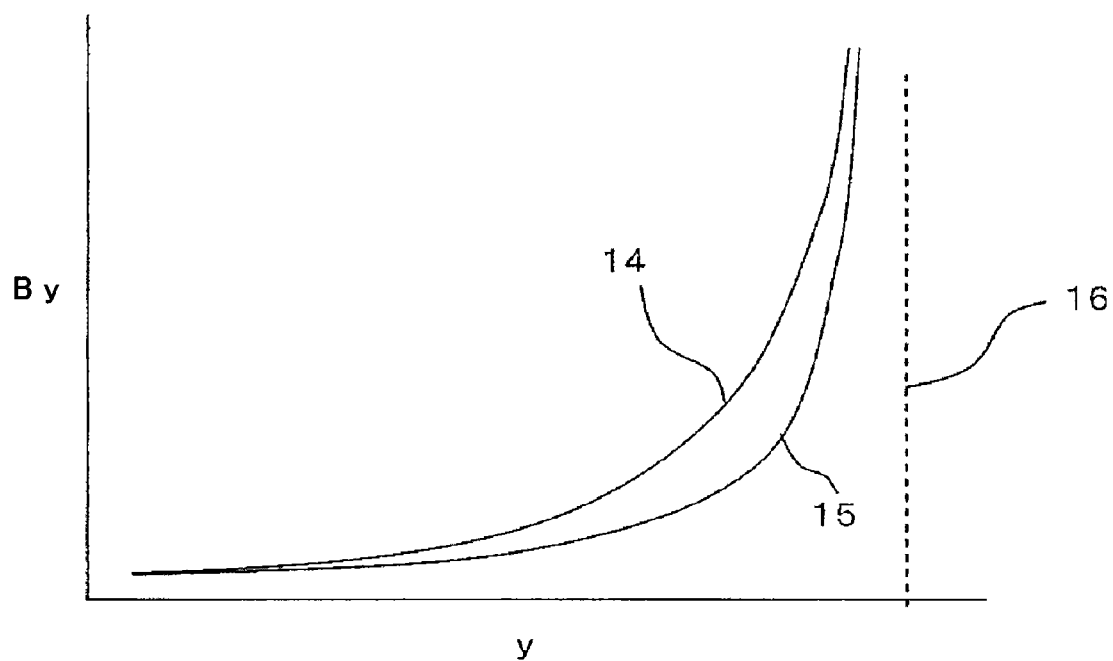
FIG. 18 is a magnetic field distribution diagram in the ends of the magnet shown in FIG. 16A.

The magnetic field distribution in the magnet end part is outlined as shown in FIG. 18 by attaching the yoke 12 shorter than the permanent magnet 1 as shown in FIGS. 16A and 16B. A curve 14 shows a "By" distribution when the yoke 12 is not attached, and a curve 15 shows a "By" distribution when the yoke 12 is attached. A dashed line 16 shows that an end of the permanent magnet 1 corresponds to this position roughly. The "By" indicates a magnetic flux density in the y-axis direction.

An increase in "By" can be reduced around the end of the permanent magnet 1 and an increase of the length of the placeable MR element 3 in the y-axis direction is obtained by using the yoke 12. In other words, as the permanent magnet 1 which is shorter than the required length of the MR element 3 can be usable, a magnetic sensor device can be compact.

In this Embodiment, the magnetic metal 21, the permanent magnet 1, and the yoke 12 are stacked sequentially in the vertical direction to form a magnetic field generator. As this magnetic field generator is placed on one surface side of the object-to-be-detected 4, this magnetic field generator can be reduced in size. The magnetic metal 21 (the end of the magnetic metal 21 on the object-to-be-detected 4 side in the z-axis direction) forms a first magnetic pole part, and the yoke 12 (the opposite end of the yoke 12 on the object-to-be-detected 4 side in the z-axis direction) forms a second magnetic pole part.

Embodiment 9

Figure 19:
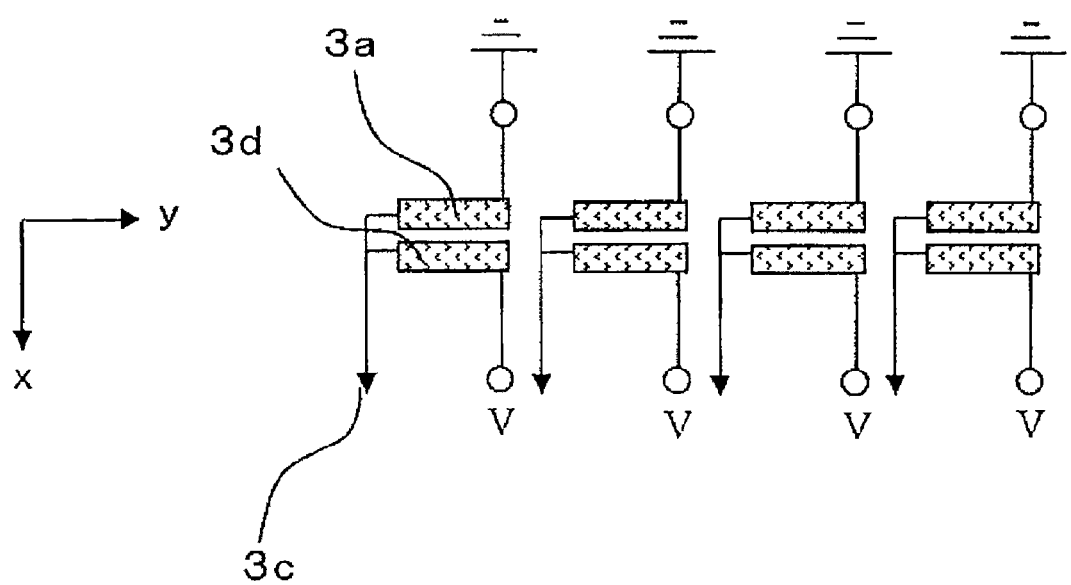
FIG. 19 is a diagram illustrating in detail the placement of a MR element of a magnetic sensor device according to Embodiment 9 of the present disclosure.

There is a method shown in FIG. 19 as another arrangement method of an MR element 3. FIG. 19 is a diagram illustrating in detail the placement of a MR element 3 of the magnetic sensor device according to Embodiment 9 of the present disclosure. As shown in FIG. 19, the MR element 3 includes a sensing element 3a, a sensing element 3d, and a signal pick-up terminal 3c. Such repetitive structures are arranged in the y-axis direction. As shown in FIG. 19, both of the sensing elements 3a and 3d are arranged in parallel extending in the y-axis direction. Such repetitive structures are arranged in the y-axis direction.

Also, in this case, the sensitivity of the MR element 3 is decreased when a magnetic field in the y-axis direction ("By") is applied. Therefore, even in the case of arranging this element, a magnetic sensor device can be compact as well as Embodiment 8 of the present disclosure by using a yoke 12 shorter than the permanent magnet 1 as shown in FIG. 16.

Embodiment 10

In Embodiments 8 and 9 of the present disclosure, a method for shortening the length of the yoke 12 to reduce the increase of "By" at the end of the permanent magnet 1 is shown. The method can be a method for shortening the length of the magnetic metal 21 along the y-axis direction shorter than the length of the permanent magnet 1 in the y-axis direction as shown in FIG. 20B in the present disclosure. FIGS. 20A and 20B are diagrams of configuration of the magnetic sensor device according to Embodiment 10 of the present disclosure. FIG. 20A is a configuration diagram of the magnetic sensor device (front view) when a magnetic sensor device is observed from the y-axis direction. FIG. 20B is a configuration diagram of the magnetic sensor device when a magnetic sensor device is observed from the x-axis direction (side view). As shown in FIG. 20B, the ends of the magnetic metal 21 in the y-axis direction are recessed from the end of the permanent magnet 1 in the y-axis direction.

Similar to the "By" distribution shown in FIG. 18, in the "By" distribution of this case, an increase of "By" in the vicinity of the end of the permanent magnet 1 in the y-axis direction is reduced then it is possible to make longer the length along the y-axis direction where the MR element 3 can be arranged. As a result, the magnetic sensor device can be compact similarly to Embodiments 8 and 9 of the present disclosure. In addition, according to this method, the arrangement of the MR element 3 of FIG. 17 and that of FIG. 19 can obtain similar effects.

In this Embodiment, the magnetic metal 21 and the permanent magnet 1 are stacked in the vertical direction to form a magnetic field generator. As the magnetic field generator is placed on one surface side of an object-to-be-detected 4, the magnetic field generator can be reduced in size. In addition, the magnetic metal 21 (the end of the magnetic metal 21 on the object-to-be-detected 4 side in the z-axis direction) forms a first magnetic pole part, and the permanent magnet 1 (the end of the permanent magnet 1 on the opposite side of the object-to-be-detected 4 in the z-axis direction) forms a second magnetic pole part.

Embodiment 11

Figure 21:
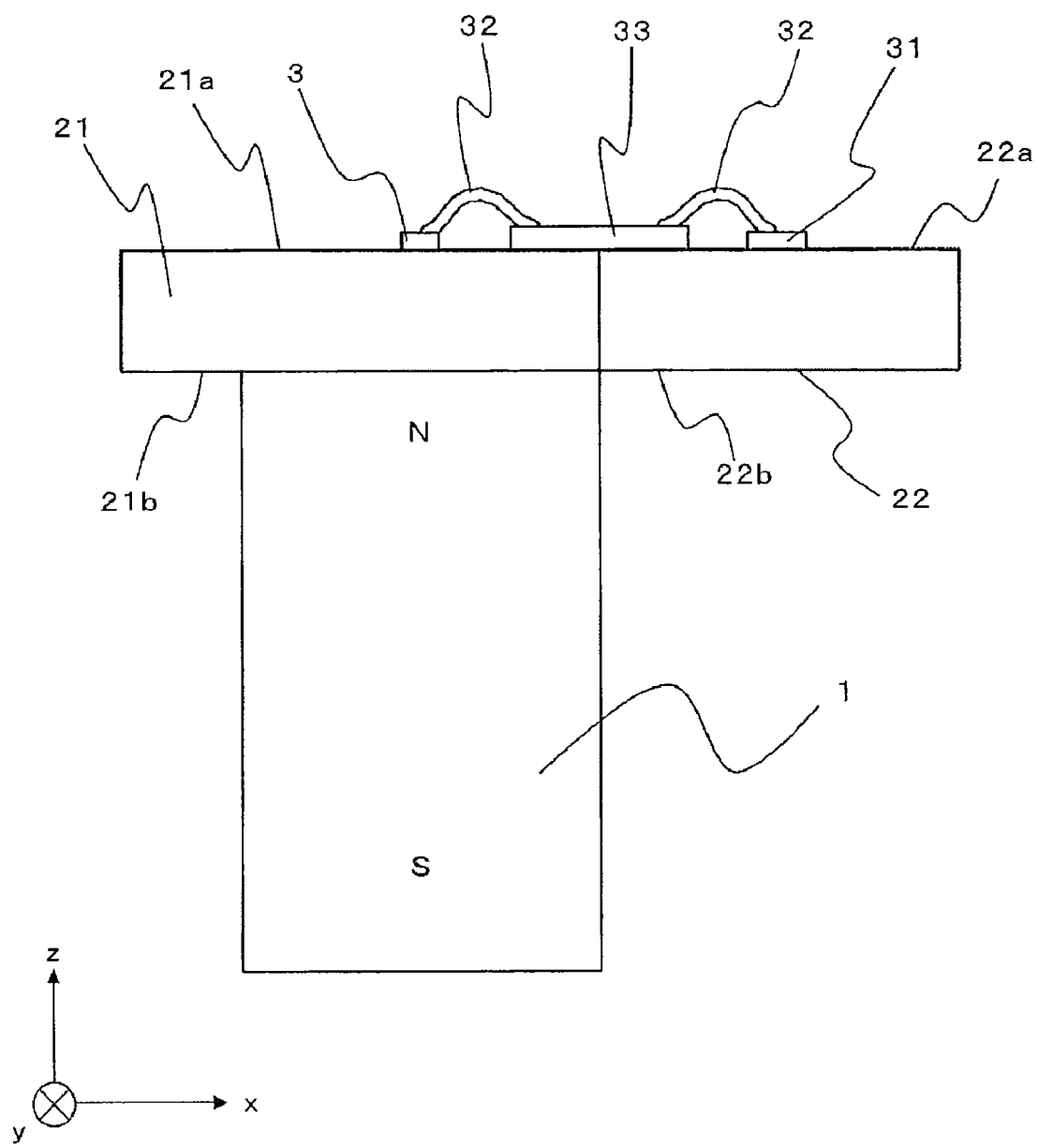
FIG. 21 is a configuration diagram of a magnetic sensor device according to Embodiment 11 of the present disclosure.

In Embodiment 7 of the present disclosure, the MR element 3 and the IC 31 are electrically connected directly with the wire 32. In the present disclosure, it is desirable to connect the MR element 3 and the IC 31 via a substrate 33 as shown in FIG. 21 considering the connection to the ground or the connection to other electrical components and the like. FIG. 21 is a configuration diagram of the magnetic sensor device according to Embodiment 11 of the present disclosure. In FIG. 21, the substrate 33 is a substrate formed of dielectric such as glass epoxy on or in which a metal wiring pattern is formed on the surface of or in the inside of the substrate 33. An MR element mounting surface 21a is an MR element mounting surface of the magnetic metal 21. A magnet contact surface 21b is a magnet contact surface of the magnetic metal 21. An IC mounting surface 22a is an IC mounting surface of the non-magnetic metal 22. A magnet contact surface 22b is a magnet contact surface of the non-magnetic metal 22. In FIG. 21, the same reference signs denote components identical or equivalent to those in FIG. 15, and the explanations are omitted.

As shown in FIG. 21, the substrate 33 is mounted on the junction between the magnetic metal 21 and the non-magnetic metal 22. The MR element 3 is electrically connected to an MR element connection pad of the substrate 33 using the wire 32 via wire bonding. The IC 31 is electrically connected to an IC connection pad of the substrate 33 using the wire 32 via wire bonding. The MR element connection pad of the substrate 33 is connected to the IC connection pad of the substrate 33 by the wiring pattern formed on the surface of or in the inside of the substrate 33 directly or via an electrical component, thereby, the MR element 3 and the IC 31 are connected via the substrate 33.

As mentioned above, the substrate 33 is mounted on the junction between the magnetic metal 21 and the non-magnetic metal 22 (the substrate 33 is in contact with both of the MR element mounting surface 21a and the IC mounting surface 22a). Therefore, the substrate 33 is inclined when a level difference occurs between the MR element mounting surface 21a and the IC mounting surface 22a. In such a case, positioning of the substrate 33 is unstable when wire bonding is performed and is inconvenient for wire bonding. Therefore, to perform wire bonding stably, the magnetic metal 21 and the non-magnetic metal 22 are required to be joined such that a level difference between the MR element mounting surface 21a and the IC mounting surface 22a decreases.

In addition, when the magnetic metal 21 and the non-magnetic metal 22 are in contact with the permanent magnet 1, the permanent magnet 1 is inclined when there is a level difference in the z-axis direction between the magnet contact surfaces 21b and 22b. When the permanent magnet 1 is inclined, surrounding magnetic fields change. Therefore, to stabilize the magnetic fields, the magnetic metal 21 and the non-magnetic metal 22 are required to be joined such that a level difference between the magnet contact surfaces 21b and 22b is decreased.

Figure 22:
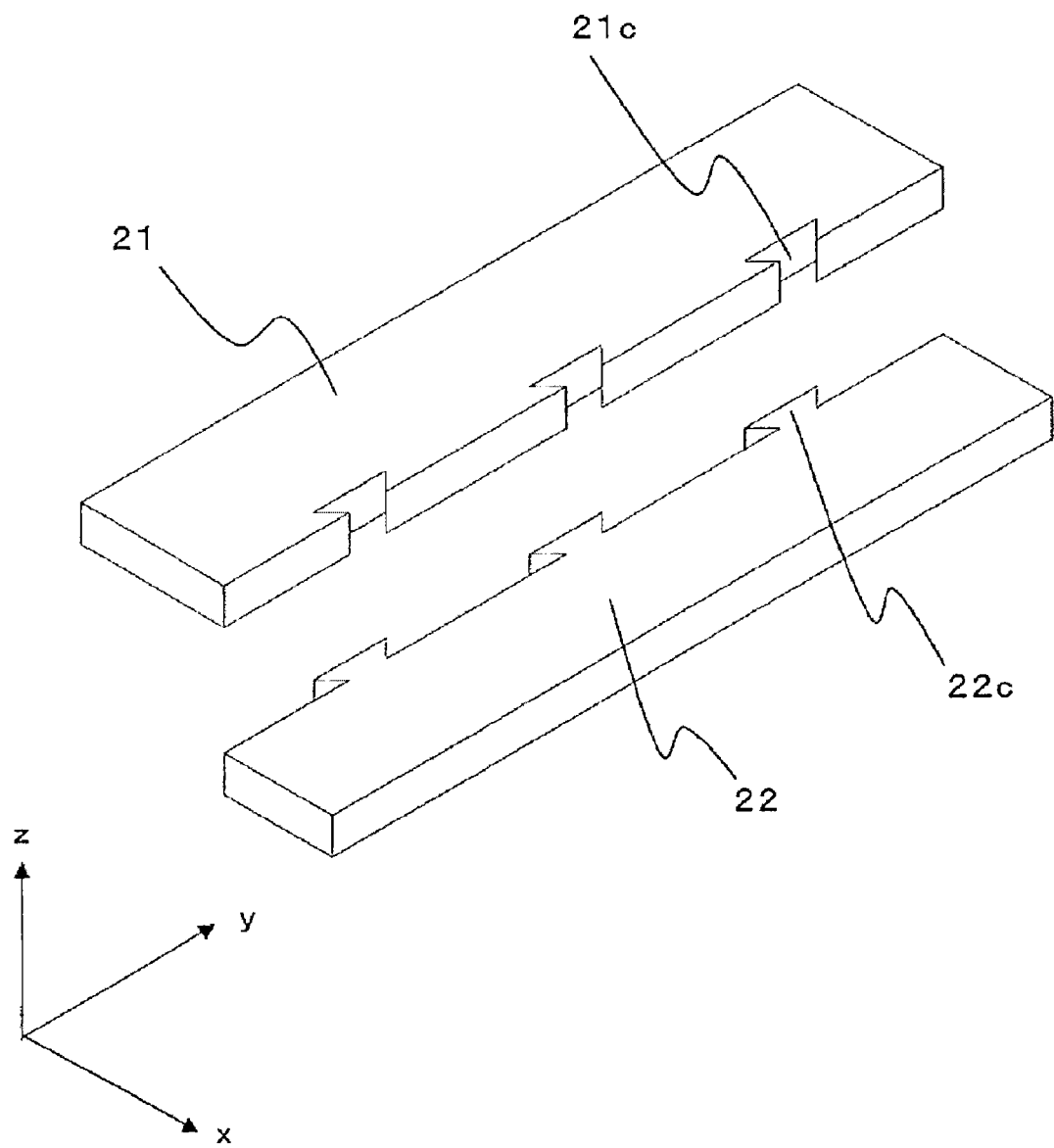
FIG. 22 is a diagram of a first joint structure of a magnetic metal and a non-magnetic metal.

FIG. 22 is a diagram of joint structure of the magnetic metal 21 and the non-magnetic metal 22 that overcomes the above-mentioned condition. A caulking portion 21c and a caulking portion 22c are caulking portions of the magnetic metal 21 and the non-magnetic metal 22, respectively.

As shown in FIG. 22, the thickness of the magnetic metal 21 is the same as the thickness of the non-magnetic metal 22, and the magnetic metal 21 and the non-magnetic metal 22 are coupled by caulking the corresponding caulking portion 21c and caulking portion 22c. At this time, the joint between the magnetic metal 21 and the non-magnetic metal 22 can be strengthened mechanically by joining not only one surface, which is required at the minimum, but all the total four surfaces, the two surfaces of the magnetic metal 21 parallel to the xz plane and the two surfaces parallel to the yz plane.

Figure 23A:
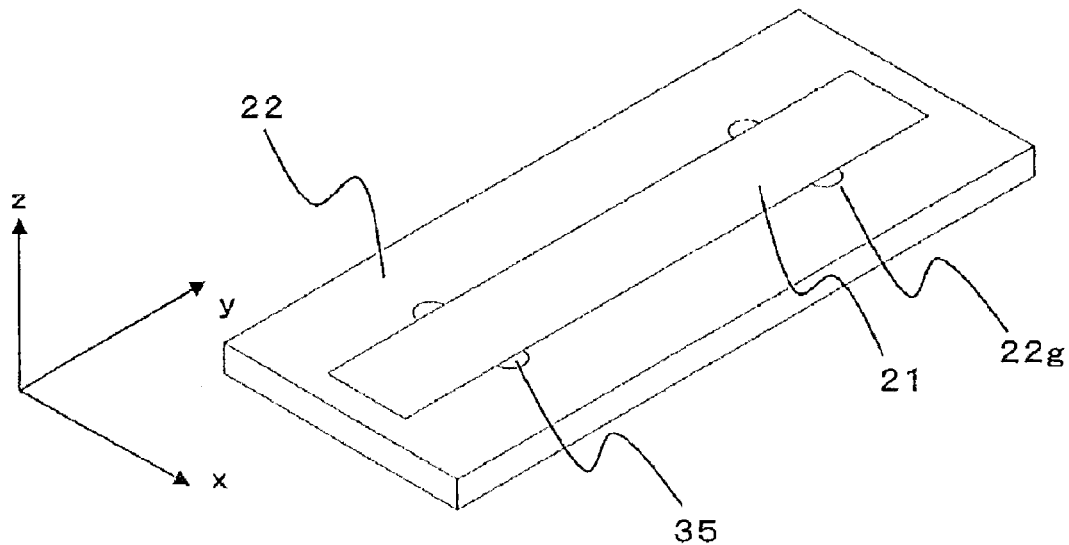
FIG. 23A is a diagram of a second joint structure of a magnetic metal and a non-magnetic metal (a first perspective view)
Figure 23B:
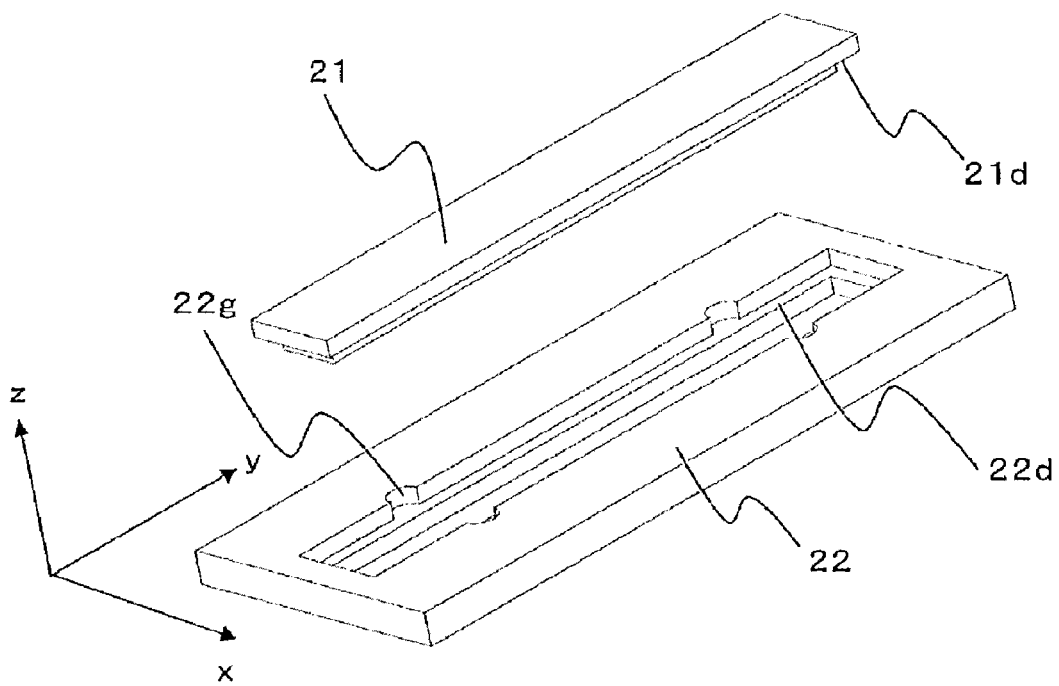
FIG. 23B is a diagram of a second joint structure of the magnetic metal and the non-magnetic metal (a second perspective view)
Figure 24A:
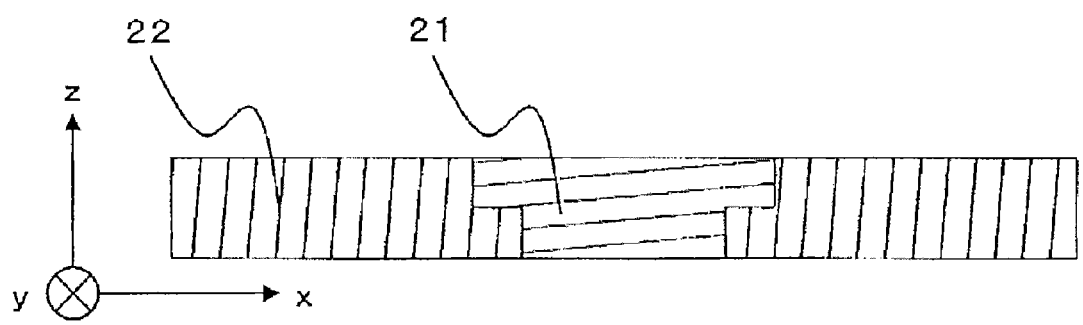
FIG. 24A is a diagram of a second joint structure of a magnetic metal and a non-magnetic metal (a first cross-sectional view)
Figure 24B:
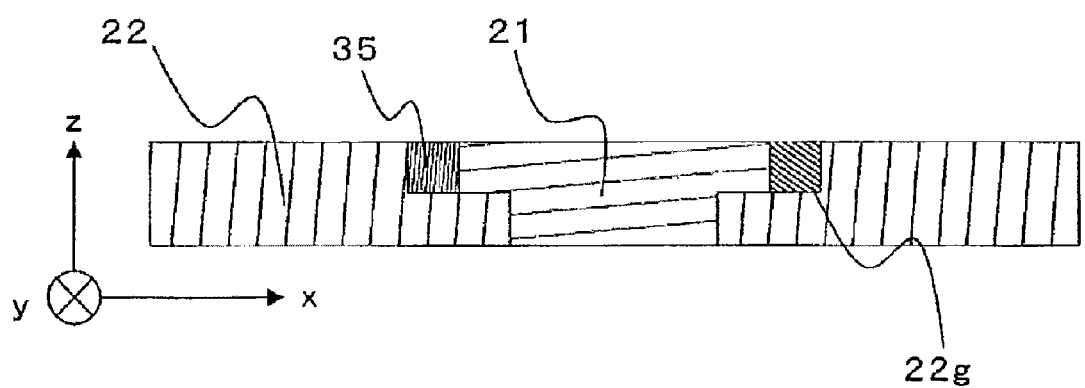
FIG. 24B is a diagram of a second joint structure of the magnetic metal and the non-magnetic metal (a second cross-sectional view)

There also is a method in which movements of the magnetic metal 21 in the x-axis direction and the y-axis direction are fixed by the non-magnetic metal 22, and movements in the z-axis direction is suppressed by an adhesive. FIGS. 23A, 23B, 24A, and 24B are other diagrams of joint structure between the magnetic metal 21 and the non-magnetic metal 22. FIGS. 23A and 23B are perspective views, and FIGS. 24A and 24B are cross-sectional view. In FIGS. 23A, 23B, 24A, and 24B, a level difference 21d is a level difference of the magnetic metal 21, a level difference 22d is a level difference of the non-magnetic metal 22, and a recess 22g is a recess formed in the non-magnetic metal 22.

The non-magnetic metal 22 has a predetermined width in the x-axis direction and is an open structure extending in the y-axis direction. This open structure has a level difference 22d such that an opening on the permanent magnet 1 side is narrow. The level difference 21d is formed on the magnetic metal 21 such that a cross section on the permanent magnet 1 side is narrow.

As shown in FIG. 23A, FIG. 23B, FIG. 24A and FIG. 24B, the level difference 22d of the non-magnetic metal 22 is fitted in the level difference 21d of the magnetic metal 21 to stop the movements in the x-axis direction and the y-axis direction. Then, deviations of the non-magnetic metal 22 and the magnetic metal 21 to the z-axis direction are suppressed by putting an adhesive 35 into the recess 22g.

Figure 25:
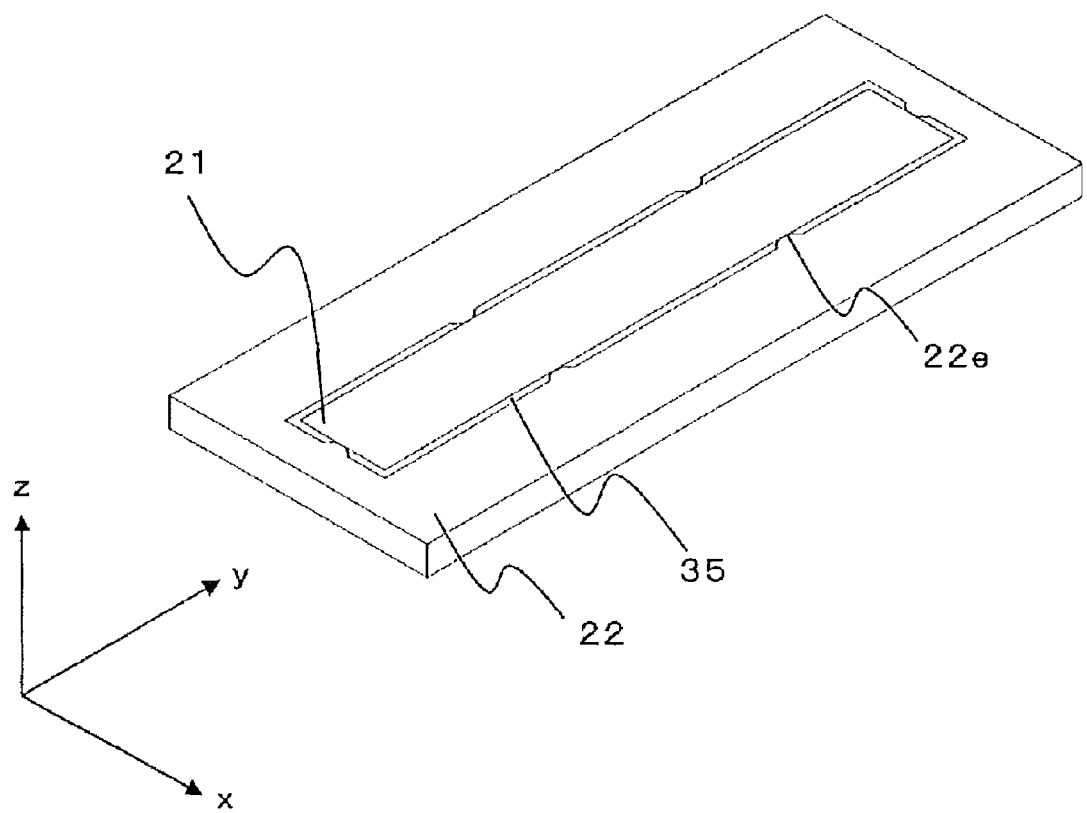
FIG. 25 is a diagram of a third joint structure of a magnetic metal and a non-magnetic metal.

There also is another method in which movements of the magnetic metal 21 in the x-axis direction and the y-axis direction are restricted by the non-magnetic metal 22, and movements in the z-axis direction are suppressed by an adhesive 35. FIG. 25 is a diagram of other joint structure of the magnetic metal 21 and the non-magnetic metal 22. In FIG. 25, a projection 22e is a projection arranged in the non-magnetic metal 22.

The non-magnetic metal 22 has a predetermined width in the x-axis direction and is an open structure extending in the y-axis direction. The magnetic metal 21 is inserted into this open structure and the movements to the x-axis direction and the y-axis direction are fixed by abutting the projection 22e of the non-magnetic metal 22 to the magnetic metal 21. Then, a gap, the size of the projection 22e, is made in the x-axis direction or the y-axis direction between the non-magnetic metal 22 and the magnetic metal 21. Then, deviations of the non-magnetic metal 22 and the magnetic metal 21 to the z-axis direction are suppressed by pouring an adhesive 35 into the gap to join the non-magnetic metal 22 and the magnetic metal 21.

Embodiment 12

Figure 26:
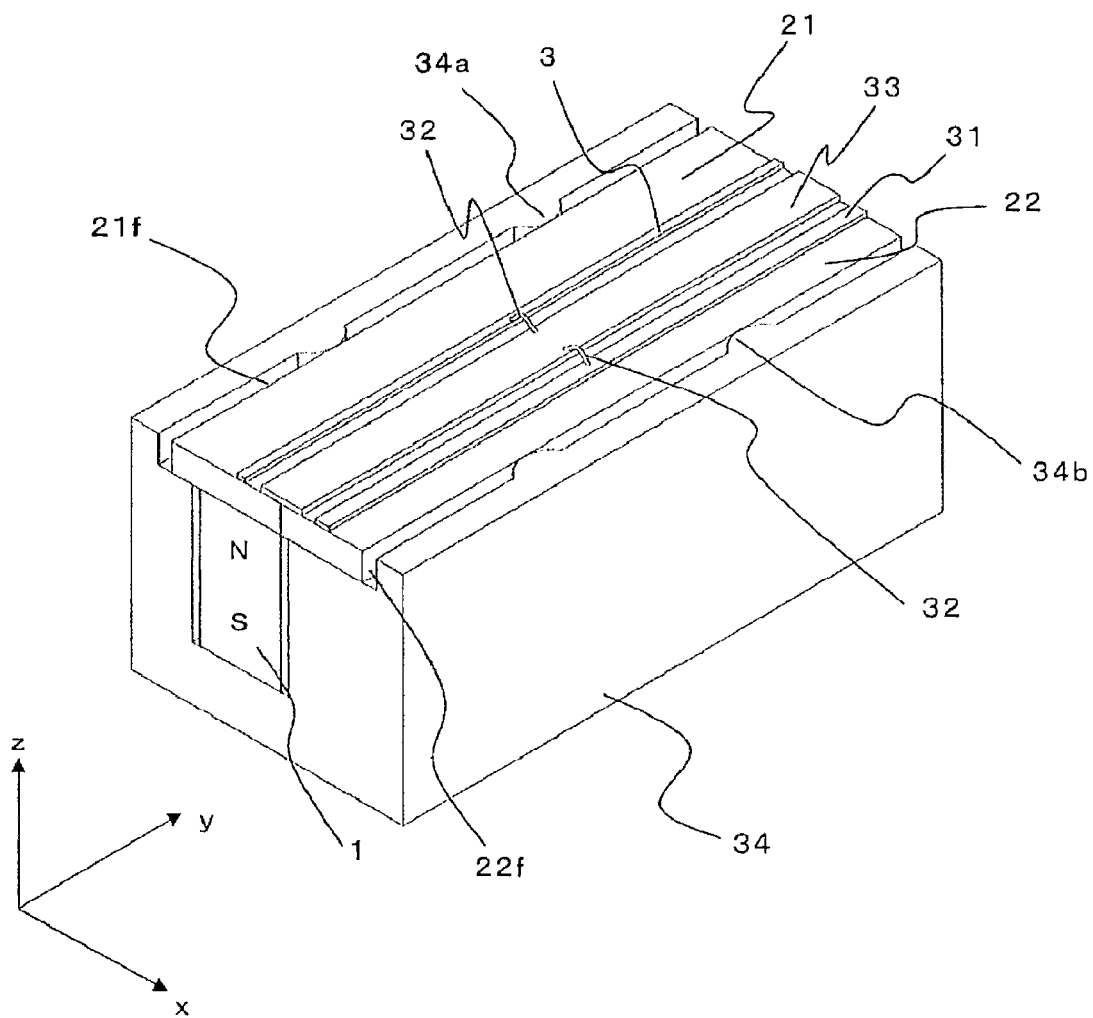
FIG. 26 is a configuration diagram of a magnetic sensor device according to Embodiment 12 of the present disclosure.

FIG. 26 is a configuration diagram of the magnetic sensor device according to Embodiment 12 of the present disclosure. FIG. 26 shows a magnetic sensor device including a housing 34 that houses and holds the magnetic sensor device according to Embodiment 11 of the present disclosure (FIG. 21). The housing 34, as a magnetic circuit, has functions of the yoke 10 in Embodiment 2 of the present disclosure.

As shown in FIG. 26, projections 34a and 34b are arranged in the housing 34. The projection 34a abuts to a side 21f, which is called a side abutted by projection, of the magnetic metal 21, and the projection 34b abuts to a side 22f, which is called a side abutted by projection, of the non-magnetic metal 22. The magnetic metal 21 and the non-magnetic metal 22 integrated with the magnetic metal 21 can be fixed in the x-axis direction by arranging at least two projections 34a and 34b in the y-axis direction.

To adjust the magnetic field from the permanent magnet 1 applied to the MR element 3, there is a case in which the position of the permanent magnet 1 is adjusted in the x-axis direction. Because the permanent magnet 1 and the magnetic metal 21 attract each other, while adjusting the position of the permanent magnet 1, the magnetic metal 21 is required to be secured to prevent the magnetic metal 21 from being attracted to the permanent magnet 1 or moved by the permanent magnet 1. As the magnetic metal 21 is fixed mechanically by adopting the configuration according to the present Embodiment, the magnetic metal 21 is fixed firmly, and is not affected by the position adjustment of the permanent magnet 1.

Needless to say, the present disclosure should not be limited to those shown in the above-mentioned embodiments. In other words, in the present disclosure, various modifications can be added to the above-mentioned embodiments. For example, in the present disclosure, configurations in the above-mentioned embodiments 1 to 12 can be combined freely.

The present disclosure can be embodied in various ways and can undergo various modifications without departing from the broad spirit and scope of the disclosure. Moreover, the embodiment described above is for explaining the present disclosure, and does not limit the scope of the present disclosure. In other words, the scope of the present disclosure is as set forth in the Claims and not the embodiment. Various changes and modifications that are within the scope disclosed in the claims or that are within a scope that is equivalent to the claims of the disclosure are also included within the scope of the present disclosure.

This application is based on Japanese Patent Application No. 2013-022380 filed on Feb. 7, 2013, Japanese Patent Application No. 2013-121916 filed on Jun. 10, 2013, and Japanese Patent Application No. 2013-221279 filed on Oct. 24, 2013, the entire disclosures of which are incorporated herein by reference including the specification, the claims, and the drawings.

REFERENCE SIGNS LIST 1, 1a, 1b Permanent magnet
2a, 2b, 2c, 10, 11, 12 Yoke
3 MR element
3a, 3d Sensing element
3b Cancellation element
3c Signal pick-up terminal
4 Object-to-be-detected
5 Central axis
6, 7, 8 Arrow
9 Lines of magnetic force
21 Magnetic metal
21a MR element mounting surface
21b, 22b Magnet contact surface
21c, 22c Caulking portion
21d, 22d Level difference
21f, 22f Side abutted by projection
22 Non-magnetic metal
22a IC mounting surface
22e, 34a, 34b Projection
22g Recess
31 IC
32 Wire
33 Substrate
34 Housing
35 Adhesive

The invention claimed is:
1. A magnetic sensor device, comprising:
a magnetic field generator including a first magnetic pole part forming a first magnetic pole and a second magnetic pole part forming a second magnetic pole having a reverse polarity of the first magnetic pole, and generating a cross magnetic field crossing a sheet-shaped object-to-be-detected containing a magnetic component at a position to which the object-to-be-detected is conveyed by the first magnetic pole part and the second magnetic pole part;

a magnetic resistance effect element disposed between the first magnetic pole part and a position to which the object-to-be-detected is conveyed, a resistance value of the magnetic resistance effect element changes according to a change in a component of the cross magnetic field in a conveying direction, the change generated by the object-to-be-detected being conveyed along the conveying direction in the cross magnetic field;

a magnetic material part formed of a metal and disposed between the first magnetic pole part and the magnetic resistance effect element;

a non-magnetic material part formed of a metal, extending in the conveying direction of the magnetic material part, and joined to the magnetic material part; and a signal processor mounted at the non-magnetic material part and connected electrically to the magnetic resistance effect element; wherein the magnetic resistance effect element is mounted at the magnetic material part; and the position of the magnetic resistance effect element in the conveying direction is a position shifted along the conveying direction from a center position of the first magnetic pole part in the conveying direction, and located between ends of the first magnetic pole part in the conveying direction.

2. The magnetic sensor device according to claim 1, wherein the magnetic field generator includes:
   a magnet including a first magnetic pole and a second magnetic pole arranged in a line in a direction orthogonal to the object-to-be-detected; and
   a yoke including a bottom part parallel with the conveying direction and configured to abut to the second magnetic pole of the magnet, and a pair of side wall parts orthogonal to the conveying direction and disposed at both ends of the bottom part in the conveying direction;

the first magnetic pole included in the magnet forms the first magnetic pole part;

the pair of the side wall parts forms the second magnetic pole part;

a projection abutting to the magnetic material part from the conveying direction is disposed inside of one side wall part of the pair of side wall parts;

a projection abutting to the non-magnetic material part from the conveying direction is disposed inside of the other side wall part of the pair of side wall parts; and the magnetic material part and the non-magnetic material part are sandwiched and fixed by the projection disposed at the one side wall part and the projection disposed at the other side wall part.

3. The magnetic sensor device according to claim 1, wherein the magnetic field generator includes:
   a magnet including a first magnetic pole and a second magnetic pole arranged in a line in a direction orthogonal to the object-to-be-detected; and
   a magnetic material part configured to abut to the first magnetic pole included in the magnet, positions of ends of the magnetic material part in a depth direction orthogonal to the conveying direction and parallel to the object-to-be-detected are inside of positions of ends of the magnet in the depth direction;

the magnetic material part forms the first magnetic pole part; and the second magnetic pole included in the magnet forms the second magnetic pole part.

4. The magnetic sensor device according to claim 1, further comprising:

a magnetic field focusing yoke mounted at the first magnetic pole part and including a recess on a surface on the object-to-be-detected side;

wherein the position of the magnetic resistance effect element in the conveying direction is a position between the ends of the recess in the conveying direction.

* * * * *